US012170189B2

(12) United States Patent
Zong

(10) Patent No.: US 12,170,189 B2
(45) Date of Patent: Dec. 17, 2024

(54) COATING APPARATUS AND COATING METHOD

(71) Applicant: JIANGSU FAVORED NANOTECHNOLOGY CO., LTD., Wuxi (CN)

(72) Inventor: Jian Zong, Wuxi (CN)

(73) Assignee: JIANGSU FAVORED NANOTECHNOLOGY CO., LTD., Wuxi (CN)

( * ) Notice: Subject to any disclaimer, the term of this patent is extended or adjusted under 35 U.S.C. 154(b) by 270 days.

(21) Appl. No.: 17/125,491

(22) Filed: Dec. 17, 2020

(65) Prior Publication Data

US 2021/0193441 A1 Jun. 24, 2021

Related U.S. Application Data

(63) Continuation-in-part of application No. 16/814,967, filed on Mar. 10, 2020, now Pat. No. 11,898,248.

(30) Foreign Application Priority Data

Dec. 18, 2019 (CN) .................. 201911310683.X

(51) Int. Cl.
*H01J 37/32* (2006.01)
*B05D 1/00* (2006.01)
(Continued)

(52) U.S. Cl.
CPC .......... *H01J 37/32715* (2013.01); *B05D 1/60* (2013.01); *B05D 1/62* (2013.01);
(Continued)

(58) Field of Classification Search
USPC ............................. 118/726, 730; 156/345.55
See application file for complete search history.

(56) References Cited

U.S. PATENT DOCUMENTS 4,769,281 A 9/1988 Shii et al.
4,777,908 A 10/1988 Temple et al.
(Continued)

FOREIGN PATENT DOCUMENTS

CN 1612661 A 5/2005
CN 1642664 A 7/2005
(Continued)

OTHER PUBLICATIONS

English Translation of First Office Action in Malaysian Patent Application No. PI2022003213, dated May 16, 2023.
(Continued)

*Primary Examiner* — Ram N Kackar
(74) *Attorney, Agent, or Firm* — Parker Highlander PLLC

(57) ABSTRACT

A coating apparatus includes a chamber body having a reaction chamber, a supporting rack, a monomer discharge source and a plasma generation source. The supporting rack has a supporting area for supporting the substrate. The monomer discharge source has a discharge inlet for introducing a coating forming material into the reaction chamber. The plasma generation source is arranged for exciting the coating forming material, wherein the supporting area of the supporting rack is located at a position between the monomer discharge source and the plasma generation source, so that the coating is evenly formed on the surface of the substrate, and the deposition velocity is increased.

12 Claims, 16 Drawing Sheets

(51) Int. Cl.
  *C23C 16/458* (2006.01)
  *C23C 16/509* (2006.01)
  *C23C 16/515* (2006.01)

(52) U.S. Cl.
  CPC ........ *C23C 16/4584* (2013.01); *C23C 16/509* (2013.01); *C23C 16/515* (2013.01); *H01J 37/3244* (2013.01); *H01J 2237/20214* (2013.01); *H01J 2237/3321* (2013.01)

(56) References Cited

U.S. PATENT DOCUMENTS

| | | |
|---|---|---|
| 4,956,196 A | 9/1990 | Wagner et al. |
| 5,214,002 A | 5/1993 | Hayashi et al. |
| 5,355,832 A * | 10/1994 | Loh .................. C23C 16/0245 |
| | | 118/723 MW |
| 5,378,284 A | 1/1995 | Geisler et al. |
| 5,447,799 A * | 9/1995 | Loh .................. H01J 37/32018 |
| | | 427/407.1 |
| 6,329,024 B1 | 12/2001 | Timmons et al. |
| 6,482,531 B1 | 11/2002 | Timmons et al. |
| 9,165,807 B2 | 10/2015 | Fukutomi et al. |
| 9,687,874 B2 | 6/2017 | Ogura et al. |
| 2003/0007910 A1* | 1/2003 | Diamant Lazarovich .................. |
| | | H01J 37/32348 |
| | | 422/186.18 |
| 2005/0178329 A1 | 8/2005 | Engle |
| 2005/0276993 A1 | 12/2005 | Sohn et al. |
| 2006/0166183 A1 | 7/2006 | Short et al. |
| 2006/0257558 A1* | 11/2006 | Nomura .............. G01N 33/6893 |
| | | 427/248.1 |
| 2007/0108161 A1 | 5/2007 | Murugesh et al. |
| 2009/0178916 A1 | 7/2009 | Kloeppel |
| 2009/0208664 A1 | 8/2009 | Iijima et al. |
| 2010/0167540 A1 | 7/2010 | Sakuma et al. |
| 2012/0164353 A1 | 6/2012 | Madocks |
| 2013/0045563 A1 | 2/2013 | Zachmann et al. |
| 2014/0110253 A1* | 4/2014 | Tamagaki ........... C23C 16/4588 |
| | | 204/298.15 |
| 2015/0136029 A1* | 5/2015 | Fujii .................... C23C 14/505 |
| | | 118/730 |
| 2015/0167162 A1 | 6/2015 | Barik et al. |
| 2015/0235812 A1 | 8/2015 | Han et al. |
| 2016/0002784 A1 | 1/2016 | Omstead |
| 2016/0168707 A1 | 6/2016 | Jang et al. |
| 2018/0174803 A1* | 6/2018 | Zong .................. C23C 16/4405 |
| 2019/0276933 A1 | 9/2019 | Zong |
| 2020/0216955 A1* | 7/2020 | Benz .................... C23C 14/568 |

FOREIGN PATENT DOCUMENTS

| | | | |
|---|---|---|---|
| CN | 101421825 A | 4/2009 | |
| CN | 102206815 A | 10/2011 | |
| CN | 104380435 A | 2/2015 | |
| CN | 104428444 A | 3/2015 | |
| CN | 106622824 A | 5/2017 | |
| CN | 106637140 A | 5/2017 | |
| CN | 106958012 A | 7/2017 | |
| CN | 107201509 A | 9/2017 | |
| CN | 206768216 U | 12/2017 | |
| CN | 109055917 A | 12/2018 | |
| CN | 109183002 * | 1/2019 | ......... C23C 16/4584 |
| CN | 109183002 A | 1/2019 | |
| CN | 109554690 A | 4/2019 | |
| EP | 2040098 A1 | 3/2009 | |
| EP | 3540093 A1 | 9/2019 | |
| EP | 3628756 A1 | 4/2020 | |
| JP | 2000252218 A | 9/2000 | |
| JP | 2009517852 A | 4/2009 | |
| KR | 20160137743 A | 12/2016 | |
| WO | WO 00/20130 A1 | 4/2000 | |
| WO | WO 2011/029096 A2 | 3/2011 | |
| WO | WO 2016/045858 A1 | 3/2016 | |
| WO | WO 2019/020391 A1 | 1/2019 | |

OTHER PUBLICATIONS

English Translation of First Office Action in Japanese Patent Application No. 2022-537843, dated Jun. 6, 2023.
English Translation of First Office Action issued in Chinese Patent Application No. 202010517189.7, dated Oct. 9, 2021.
English Translation of First Office Action issued in Chinese Patent Application No. 202010517204.8, dated Nov. 2, 2021.
English Translation of First Office Action issued in Chinese Patent Application No. 202010517576.0, dated Oct. 9, 2021.
English Translation of Second Office Action issued in Chinese Patent Application No. 202010517576.0, dated Apr. 20, 2022.
English Translation of First Office Action issued in Chinese Patent Application No. 202080001814.0, dated Feb. 25, 2022.
English Translation of First Office Action issued in Chinese Patent Application No. 202080001818.9, dated Feb. 25, 2022.
First Office Action issued in Indian Patent Application No. 202217040238, dated Dec. 6, 2022.
First Office Action issued in Indian Patent Application No. 202217040240, dated Jan. 23, 2023.
Partial Supplementary European Search Report issued in European Patent Application No. 20901681.5, dated Jan. 30, 2024.
Extended European Search Report issued in European Patent Application No. 20901681.5, dated May 22, 2024.
Office Action issued in Korean Patent Application No. 10-2022-7024399, dated Jun. 18, 2024. (English translation).

* cited by examiner

A-A

B-B

C-C

| example | thickness/nm | contact angle/° |
|---|---|---|
| example 1 | 186 | 112 |
| example 2 | 204 | 108 |
| example 3 | 192 | 116 |
| example 4 | 212 | 125 | under a coating process is arranged between a discharge source of a coating forming material and a plasma generation source to avoid an excessive decomposition of the coating forming material during the coating process.

COATING APPARATUS AND COATING METHOD

CROSS REFERENCE OF RELATED APPLICATION

This application is a Continuation-In-Part application that claims the benefit of priority under 35 U.S.C. § 120 to a non-provisional application, application Ser. No. 16/814,967, filed on Mar. 10, 2020, which is a non-provisional application that claims priority under 35 U.S.C. § 119 to a China application number CN201911310683.X, filed on Dec. 18, 2019, which are incorporated herewith by references in their entities.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to coating deposition, and more particularly to a coating apparatus and coating method for applying and forming a coating on a substrate which is adapted for being arranged between a discharge source of a coating forming material and a plasma generation source to avoid an excessive decomposition of the coating forming material during a coating forming process.

Description of Related Arts

A coating apparatus is arranged for forming a polymer nanocoating or film layer on a surface of a substrate, which is made of a material comprising, but is not limited to, metal, glass, ceramic, plastic, polymer, fabrics, fibers, powder, and semiconductor, to improve various properties of the substrate such as hydrophobic, hydrophilic, oleophobic, anti-rust, mildew proof, moisture barrier, electrical and thermal conductive, biomedical, optical, and tribological performances.

A typical coating apparatus implementing a PECVD (Plasma Enhanced Chemical Vapor Deposition) process is generally constructed for introducing a gaseous coating forming material into a vacuum chamber, in which one or more substrates are disposed, to form a polymer layer on the surface of the substrate. More specifically, the gaseous coating forming material, which may comprise, but is not limited to, an organic material, an organosilicon material, an inorganic material, and a combination thereof, is a gaseous monomer or monomer vapor which is activated to be in a plasma state by discharging electrical power to the monomer to produce various types of reactive precursor species. And then, reactions between the reactive precursor species and the monomer, or between the reactive precursor species themselves take place and the polymer film is then deposited and formed on the surface of the substrate.

The monomer should be excited to produce the reactive precursor species, but an excessive exposure of the monomer in the plasma exciting media can result in an excessive decomposition of the monomer, so that a deposition velocity and a uniformity of the polymer coating is adversely affected.

Referring to FIG. 1A of the drawings, a conventional coating apparatus includes a chamber body 1, a discharge source 2 of coating forming material for introducing the coating forming material into the chamber body 1, and a plasma generation source 3 for applying an electrical power to the coating forming material so as to excite the coating forming material. As shown in the drawings, one or more substrates 4 are disposed between opposite electrodes of the plasma generation source 3. The coating forming material disperses into the space between opposite electrodes of the plasma generation source 3 to undergo an exciting process for generating the reactive precursor species. Since the coating forming material should be excited in the effect of the plasma generation source 3 and then deposit on the substrates 4 which are placed in the plasma generation source 3, an excessive decomposition of the coating forming material may occur. In addition, the exposure of the substrates 4 between the electrodes of the plasma generation source 3 may also result in a damage to the substrates 4.

Referring to FIG. 1B of the drawings, another conventional coating apparatus includes a chamber body 1, a discharge source 2 of coating forming material, and a plasma generation source 3 which is placed between the discharge source 2 of coating forming material and the substrates 4 to be coated. During the coating method, the coating forming material is required to pass through the space between opposite electrodes of the plasma generation source 3 to implement the exciting process for generating the reactive precursor species before reaching to the substrates 4.

U.S. Pat. No. 7,968,154B2, entitled "Atomization of a precursor into an excitation medium for coating a remote substrate" and U.S. Pat. No. 8,029,872B2, entitled "Application of a coating forming material onto at least one substrate" have disclosed such above coating apparatus including an atomized monomer source and a plasma excitation medium. The substrates and the atomized monomer source are respectively located on two opposite sides of the plasma excitation medium that the atomized monomer source passes through the plasma excitation medium, and then is deposited on the surfaces of the substrates on the opposite side of the plasma excitation medium to form the polymer coating. It thus can be seen that the atomized monomer can only be deposited on the surfaces of the substrates after passing through the plasma excitation medium. The plasma excitation medium can cause a relative large portion of the atomized monomer to decompose for a relatively long time, so that excessive decomposition of the atomized monomer may take place, and thus the formed coating is hard to retain the chemical properties of the atomized coating forming material.

U.S. application Ser. No. 16/095,179 entitled "Multi-source low-power low-temperature plasma polymerized coating device and method" has disclosed a coating device by replacing a single high-frequency discharge source with large area and high power by combining a plurality of high-frequency discharge sources with a small area and a low power. However, this method still somehow excessively destroys a chemical monomer structure of the monomer and causes unsatisfied quality of the formed polymer coating, and the structure of the device is relatively complicated and difficult for assembling.

SUMMARY OF THE PRESENT INVENTION

The present invention is advantageous in that it provides a coating apparatus and coating method, wherein a substrate is adapted to be formed with a coating on a surface thereof without an excessive decomposition of a coating forming material during a plasma polymerization coating method.

Another advantage of the present invention is to provide a coating apparatus and coating method, wherein the substrate to be coated is adapted for being placed between a monomer discharge source for introducing the coating forming material into a chamber body and a plasma generation source for exciting the coating forming material, so that the coating forming material which is a gaseous monomer or monomer vapor is not required to pass through the plasma generation source before reaching to the substrate, and thus the excessive decomposition of the coating forming material is reduced.

Another advantage of the present invention is to provide a coating apparatus and coating method, wherein the substrate to be coated is adapted to be placed at a position having a smaller distance away from the monomer discharge source than the plasma generation source in such a manner that at least a portion of the coating forming material reaches an area for positioning the substrate before reaching to the plasma generation source, so that not all of the coating forming material is required to pass through the plasma generation source before reaching to the substrate.

Another advantage of the present invention is to provide a coating apparatus and coating method, wherein the configuration of the monomer discharge source, a supporting rack for supporting the substrate, and the plasma generation source is able to maintain a desired level of reactions between reactions between reactive precursor species, which are produced by a proportion of the monomer reaching to the plasma generation source, and another proportion of the monomer which has not decomposed into the reactive precursor species, so as to increase a quality of the formed polymer coating on the surface of the substrate.

Another advantage of the present invention is to provide a coating apparatus and coating method, wherein according to some embodiments, the substrate to be coated can be supported on the supporting rack which is a movable between the monomer discharge source and the plasma generation source, so as to adjust the distance between the substrate and the plasma generation source, so as to control and adjust a composition of a formed polymer material which is deposited on the surface of the substrate.

Another advantage of the present invention is to provide a coating apparatus and coating method, wherein according to some embodiments, the plasma generation source is provided at a substantial central position of a reaction chamber of the chamber body while a plurality of the substrates can be arranged around the plasma generation source, wherein the coating forming material, which can be discharged from the monomer discharge source at a position adjacent to an inner wall of the chamber body, radially disperses into the reaction chamber and has to pass through the area for placing the substrate before reaching to the plasma generation source.

Another advantage of the present invention is to provide a coating apparatus and coating method, wherein according to some embodiments, the supporting rack for supporting the substrate can be embodied to comprise a rotation rack that rotate with respect to the plasma generation source in the reaction chamber to change a relative position between the substrate and the plasma generation source, and also functions to stir the gaseous coating forming material dispersed into the reaction chamber, so as to increase a uniformity of the polymer coating formed on the surface of the substrate.

Another advantage of the present invention is to provide a coating apparatus and coating method, wherein according to some embodiments, a relative movement between the substrate and the monomer discharge source of the coating forming material is controllable, so as to adjust an amount of the coating forming material, which has not been subject to an exciting process by the plasma generation source, reaching to the substrate, so that adequate reactions of the reactive precursor species and the monomer allow the polymer coating with high quality to be deposited on the surface of the substrate.

Another advantage of the present invention is to provide a coating apparatus and coating method, wherein according to some embodiments, a relative movement between the substrate and the plasma generation source is controllable to control the amount of the reactive precursor species reaching to the substrate, rendering adequate reactions of the reactive precursor species and the monomer before the formation of the polymer coating on the surface of the substrate.

Another advantage of the present invention is to provide a coating apparatus and coating method, wherein according to some embodiments, the substrate is adapted for being supported on a carrier rack which is operable to rotate about its central axis and is also rotating along with an rotation rack, so as to adjust a relative position between the substrate and the plasma generation source, so as to adjust the amount of the reactive precursor species and the monomer reaching to the substrate for forming the polymer coating on the surface of the substrate.

Another advantage of the present invention is to provide a coating apparatus and coating method, wherein the substrate to be coated is adapted for being arranged at an outer side of the plasma generation source, so as to avoid a damage to the substrate by the plasma generation source during the coating process.

Another advantage of the present invention is to provide a coating apparatus and coating method, wherein the coating is evenly formed on the surface of the substrate, and the deposition velocity is increased.

Another advantage of the present invention is to provide a coating apparatus and coating method, wherein the amount of the coating forming material used for forming the polymer coating is increased, so as to avoid waste and reduce cost.

Another advantage of the present invention is to provide a coating apparatus and coating method, wherein branching and cross-linking in a molecular structure of the polymer coating are enhanced, and an integrity of the molecular structure of the polymer coating is achieved, so as to ensure a good performance of the polymer coating.

Another advantage of the present invention is to provide a coating apparatus and coating method, wherein the apparatus is simple in structure, easy for operation and maintenance.

Additional advantages and features of the invention will become apparent from the description which follows, and may be realized by means of the instrumentalities and combinations particularly pointing out in the appended claims.

According to the present invention, the foregoing and other objects and advantages are attained by a coating apparatus for coating a substrate, wherein the coating apparatus comprises a chamber body, a monomer discharge source and a plasma generation source. The chamber body has a reaction chamber, wherein the chamber body has a substrate positioning area for positioning the substrate. The monomer discharge source has a discharge inlet for introducing a coating forming material into the reaction chamber of the chamber body. The plasma generation source is disposed in the reaction chamber of the chamber body for exciting the coating forming material, wherein the substrate positioning area is located at a position between the monomer discharge source and the plasma generation source in such manner that the substrate is adapted for being arranged between the monomer discharge source and the plasma generation source.

According to another aspect of the present invention, the present invention provides a coating apparatus for coating a substrate, wherein the coating apparatus comprises a chamber body having a reaction chamber, a supporting rack, a monomer discharge source and a plasma generation source. The supporting rack has a supporting area for supporting the substrate within the reaction chamber of the chamber body. The monomer discharge source has a discharge inlet for introducing a coating forming material into the reaction chamber of the chamber body. The plasma generation source is disposed in the reaction chamber of the chamber body for exciting the coating forming material, wherein the supporting area of the supporting rack is located at a position between the monomer discharge source and the plasma generation source in such manner that the substrate is adapted for being arranged between the monomer discharge source and the plasma generation source.

According to another aspect of the present invention, the present invention provides a coating method for coating a substrate, wherein the coating method comprises the following steps.

(a) Arrange the substrate in a reaction chamber of a chamber body at a position between a monomer discharge source and a plasma generation source.

(b) Introduce a coating forming material into the reaction chamber through the monomer discharge source for forming a polymer coating on a surface of the substrate in the effect of the plasma generation source.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Figure 1A:
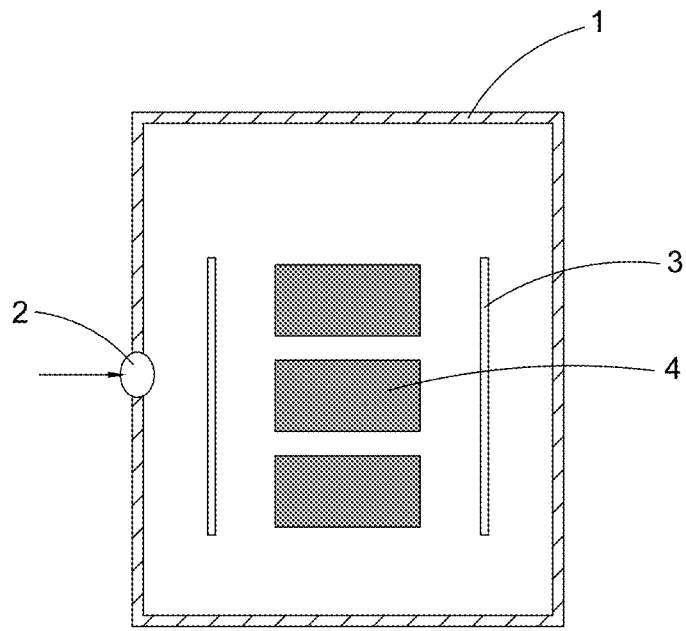
FIG. 1A is a schematic view of a conventional coating apparatus.
Figure 1B:
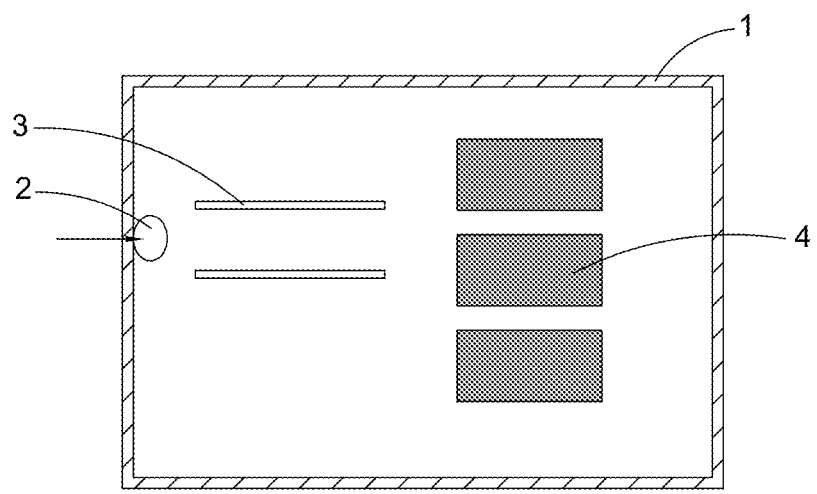
FIG. 1B is a schematic view of another conventional coating apparatus.
Figure 2A:
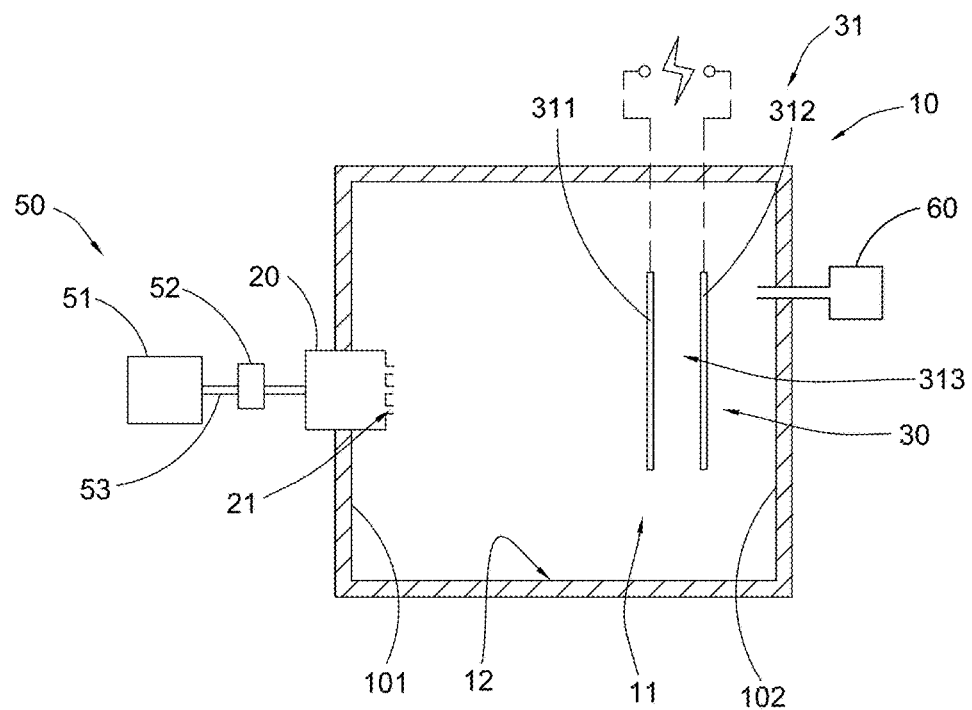
FIG. 2A is a schematic view illustrating a coating apparatus according to a first preferred embodiment of the present invention.
Figure 2B:
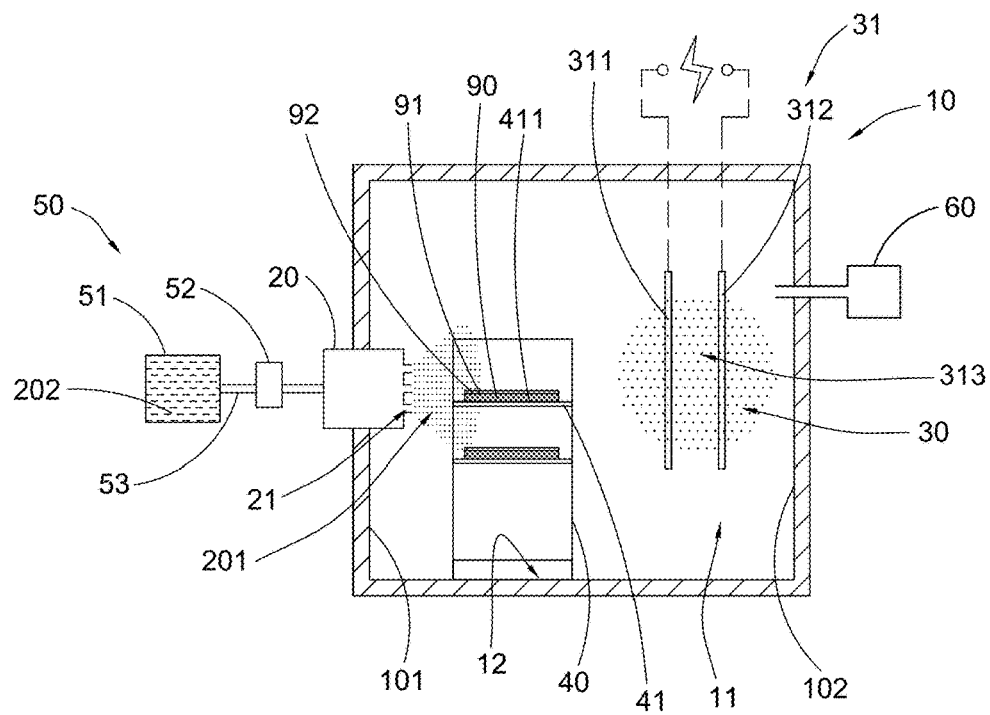
FIG. 2B is a schematic view illustrating the coating apparatus being placed with a substrate for implementing the coating method according to the above first preferred embodiment of the present invention.

Referring to FIGS. 2A and 2B of the drawings, a coating apparatus which is arranged to implement a novel plasma polymerization coating method for forming a polymer coating 92 on a surface 91 of a substrate 90 according to a first preferred embodiment of the present invention is illustrated. More specifically, the coating apparatus comprises a chamber body 10 defining a reaction chamber 11, a monomer discharge source 20 communicated to the reaction chamber 11 for introducing a gaseous coating forming material 201, which is a gaseous monomer or monomer vapor, into the reaction chamber 11 of the chamber body 10, and a plasma generation source 30 operable to induce an electrical filed internally of the reaction chamber 11 for forming a plasma in such a manner that the plasma generation source 20 applies an electrical power to the coating forming material 201 to excite the coating forming material 201, so as to break down the coating forming material 201 to form reactive precursor species, so that the coating forming material 201 is activated to be in a plasma state, so as to induce reactions between the reactive precursor species and the monomer, as well as reactions between the reactive precursor species themselves in the reaction chamber 11 of the chamber body 10, so that the polymer coating 92 is then deposited and formed on the surface 91 of the substrate 90.

According to this preferred embodiment of the present invention, as shown in FIG. 2B of the drawings, the plasma generation source 30 is arranged in the reaction chamber 11 of the chamber body 10 at a position remotely from the monomer discharge source 20, the chamber body 10 has a substrate positioning area 12 which is arranged between the monomer discharge source 20 and the plasma generation source 20, so that at least one substrate 90 is suitable for being arranged in the reaction chamber 11 between the monomer discharge source 20 and the plasma generation source 30 during a plasma polymerization coating method of the present invention for forming the polymer coating 92 of the surface 91 of the substrate 90.

Accordingly, during the plasma polymerization coating method of the substrate 90, one or more substrates 90 can be disposed at the substrate positioning area 12 of the chamber body 11 in such a manner that the monomer discharge source 20 is arranged at a first side of the substrate 90 and the plasma generation source 30 is located at an opposite second side of the substrate 90, so that when the coating forming material 201 is discharged into the reaction chamber 11 of the chamber body 10, the coating forming material 201 does not have to pass through the plasma generation source 30 before reaching to the substrate 90, so as to avoid the excessive decomposition of the coating forming material 201.

More specifically, when the monomer discharge source 20 is in operation to discharge the coating forming material 201, the coating forming material 201 disperses into the reaction chamber 11 of the chamber body 10 and reaches the substrate positioning area 12 of the chamber body 10 first, only a proportion of the coating forming material 201 is subject to an exciting process of the plasma generation source 30, rendering the coating forming material 201 to decompose, polymerize and deposit on the surface 91 of the substrate to form the polymer coating 92.

In the plasma polymerization coating method of the instant invention, since the substrate 90 is adapted for being placed in a flowing route of the coating forming material 201 which flows from the monomer discharge source 20 to the plasma generation source 30, and a distance between the substrate 90 and the monomer discharge source 20 is smaller than a distance between the substrate 90 and the plasma generation source 30, not all of the coating forming material 201 is excited by the plasma generation source 30, so that excessive decomposition of the coating forming material 201 is avoided.

The substrate 90 can be directly placed on the substrate positioning area 12 of the chamber body 10. Alternatively, as shown in FIG. 2B of the drawings, a plurality of substrates 90 can be placed on a supporting rack 40, and then the supporting rack 40 which is loaded with the plurality of substrates 90 can be placed on the substrate positioning area 12 of the chamber body 10 and is received in the reaction chamber 11 of the chamber body 10. Alternatively, the supporting rack 40 can be placed on the substrate positioning area 12 of the chamber body 10 and is received in the reaction chamber 11 of the chamber body 10, and then the plurality of substrates 90 can be placed on a supporting rack 40. As another alternative mode, the supporting rack 40 is mounted to the chamber body 10 and is disposed in the reaction chamber 11, during the coating process, the plurality of the substrates 90 is put on the supporting rack 40.

The supporting rack 40 comprises a carrier rack 41 which may comprise multiple supporting platforms for supporting multiple layers of the substrates 90. The carrier rack 41 has a supporting area 411 for placing and supporting the substrate 90, and the supporting area 411 is arranged between the monomer discharge source 20 and the plasma generation source 30. In alternative modes, the whole supporting rack 40 may not be arranged between the monomer discharge source 20 and the plasma generation source 30, but as along as the supporting area 411 of the supporting rack 40 for supporting the substrate 90 is arranged between the monomer discharge source 20 and the plasma generation source 30, the substrate 90 which is adapted for being placed on the supporting area 411 of the supporting rack can be located between the monomer discharge source 20 and the plasma generation source 30.

The person of ordinary skilled in the art should understand that the substrate positioning area 12 of the chamber body 10 is an area for directly supporting one or more substrates 90, or an area for supporting and accommodating the supporting rack 40 which is adapted for being loaded with one or more substrates 90.

The chamber body 10 of the present invention is a housing defining the reaction chamber 11. A cross section of the reaction chamber 11 of the chamber body 10 can be, but not limited to, a circular shape, an oval shape, an a polygonal shape such as a rectangular shape, a pentagonal shape, a hexagonal shape, a heptagonal shape, an octagonal shape, a nonagonal shape, and a decagonal shape. As an example of this preferred embodiment, the chamber body 10 is configured to have a rectangular reaction chamber 11. The monomer discharge source 20 is arranged at a first side of the rectangular reaction chamber 11 while the plasma generation source 30 can be arranged at an opposite second side of the rectangular reaction chamber 11. As shown in the drawings, the monomer discharge source 20 can be arranged adjacent to a first side wall 101 of the chamber body 10 while the plasma generation source 30 is remotely from the monomer discharge source 20 and is arranged at a second side wall 102 of the chamber body 10 which is opposite to the first side wall 101 of the chamber body 10.

The monomer discharge source 20 has at least one discharge inlet 21 for introducing the coating forming material 201 into the reaction chamber 11 of the chamber body 10. The discharge inlet 21 can be formed in a wall of the chamber body 10 and penetrate a thickness of the wall of the chamber body 10. Alternatively, the discharge inlet 21 can be formed in a feeding nozzle which is embedded in the wall of the chamber body 10. Alternatively, the discharge inlet 21 is formed in a feeding nozzle, which is a feeding head at a distal end of a feeding tube, extending into the reaction chamber 11 of the chamber body 10.

According to this preferred embodiment of the present invention, the coating apparatus further comprises a monomer supply unit 50 for supplying the coating forming material 201 to the monomer discharge source 30. More specifically, the monomer supply unit 50 of this preferred embodiment comprises a material storage member 51 for storing a raw material 202 of the coating forming material 201, a vaporizer 52 for vaporizing the raw material 202, and a delivering tube system 53 for delivering the raw material 202 from the material storage member 51 to the monomer discharge source 20. Accordingly, the coating forming material 201 discharged through the monomer discharge source 20 is a gaseous monomer vapor material. The raw material 202 of the coating forming material 201 can be a liquid or liquid/solid slurry, either alone or in mixture, and the vaporizer 52 can comprise an atomizer, a heating device, an ultrasonic nozzle, or a nebulizer. As an example, the vaporizer 52 may comprise a heating device which is provided for heating the raw material 202 in the delivering tube system 53 for producing the gaseous monomer vapor material. The heating device may be provided at any position along the delivering tube system 53. Typically, the heating device may be provided at the position corresponding to the monomer discharge source 20, so that when the raw material 202 in a liquid state is delivered to the monomer discharge source 20, the raw material 202 will be heated by the heating device and produce the gaseous monomer vapor material which is discharged into the reaction chamber 11. The raw material 202 of the coating forming material 201 can be a powder, and the vaporizer 52 can be a plain-jet gas blast atomizer. In addition, a carrier gas may also be supplied along with the coating forming material 201. The number of the material storage member 51, the vaporizer 52, the delivering tube system 53, and the monomer discharge source 20 is not limited, one or more material storage members 51, vaporizers 52, delivering tube systems 53, and monomer discharge sources 20 may be adopted in some embodiments.

An electrical discharge manner of the plasma generation source 30 comprises, but not limited to, a direct current discharge, an alternating current discharge, an audio frequency discharge, a radio frequency discharge by a capacitive coupling or an inductive coupling, a microwave discharge by a resonant cavity, a surface wave coupling or an electron cyclotron resonance, a medium frequency discharge, a penning discharge, a spark discharge and a pulse discharge. In addition, the plasma generation source 30 can be operated to discharge electric power continuously, or in a pulsed manner.

As shown in FIGS. 2A and 2B of the drawings, the plasma generation source 30 comprises an electrode means 31 for generating an electric filed in the reaction chamber 11 for establishing the plasma in the reaction chamber 11 of the chamber body 10. According to this preferred embodiment, the electrode means 31 comprises a first electrode 311 and a second electrode 312 defining a discharge field 313 between the first and second electrodes 311 and 312. As a typical example, the pair of electrodes 311 and 312 of this preferred embodiment functioning as positive and negative electrodes is disposed in the reaction chamber 11 of the chamber body 10 at a position remotely from the monomer discharge source 20, and is connected to an energy source such as an RF generator which is placed at an outer side of the chamber body 10. Alternatively, the first electrode 311 can be electrically connected to the energy source, and the second electrode 312 can be grounded. Preferably, each of the first and second electrodes 311 and 312 may further be embodied as a porous electrode which has a plurality of holes communicating the discharge filed 313 with the reaction chamber 11.

The coating forming material 201 itself can function as a plasma source gas. Furthermore, the coating apparatus may further comprise a plasma source gas feeding unit for feeding a plasma source gas, which includes, but not limited to, an inert gas and nitrogen, into the reaction chamber 11 of the chamber body 10. Accordingly, before the monomer discharge source 20 feeds the coating forming material 201 into the reaction chamber 11, the plasma source gas can be injected into the reaction chamber 11 to produce the plasma in the effect of the plasma generation source 30, so as to provide a plasma environment for the coating forming material 201. In addition, the carrier gas may function as the plasma source gas, and is introduced into the reaction chamber 11 for generating the plasma before feeding the coating forming material 201 into the reaction chamber 11.

It is appreciated that the person of ordinary skilled in art is able to recognize that one or more additional discharge sources for discharging the coating forming material 201 may be arranged at the chamber body 10 in such a manner that the plasma generation source 30 is at a position between the substrate 90 and the additional discharge sources for discharging the coating forming material 201. In these embodiments, a proportion of the coating forming material 201 is discharged through the monomer discharge source 20 at a position adjacent to the substrate position area 101 of the chamber body while another proportion of the coating forming material 201 is discharged through the additional discharge source and passes through the plasma generation source 30 before reaching to the substrate 90, so that not all of the coating forming material 201 is excited by the plasma generation source 30, so as to prevent all of the coating forming material 201 being decomposed into small species.

In addition, the coating apparatus may further comprise other components such as a pressure adjustment unit 60 which is adjacent to the plasma generation source 30 and remotely from the monomer discharge source 20 for adjusting a pressure in the reaction chamber 11 of the chamber body 10, a control unit for controlling the operation of the coating apparatus, a tail gas tube for collecting a tail gas. During the plasma polymerization coating method of the present invention, the reaction chamber 11 is a vacuum chamber in the effect of the pressure adjustment unit 60 before feeding the coating forming material 201 into the reaction chamber 11. The term "vacuum chamber" means a chamber having a lower gas pressure than what is outside of the chamber, and the term does not necessarily mean that the chamber is exhausted to a vacuum state.

The substrate 90 of the present invention comprises metal, glass, ceramic, plastic, polymer, fabrics, fibers, powder, and semiconductor, and can be, but not limited to an electronic component or electronic device, a mechanical component or mechanical device, a textile or clothing, a glass product, a ceramic product, and etc. For instance, the electronic component or electronic device can be, but not limited to, a mobile phone, a pager, a radio, a loudspeaker, a microphone, a ringer, a buzzer, a hearing aid, an audio player, a television, a laptop, a notebook, a tablet computer, a keyboard, a PCB circuit board, a display, or a sensor. The polymer coating 92 can be, but not limited to a hydrophobic coating, a hydrophilic coating, an oleophobic coating, an anti-rust coating, a mildew proof coating, a moisture barrier coating, an electrical and thermal conductive coating, a biomedical coating, an optical coating, and a tribological coating. The coated surface 91 of the substrate 90 can be an entire surface of the substrate 90, or a partial area of the entire surface of the substrate 90.

The polymer coating 92 can be formed as an acrylic coating, an epoxy coating, a silicone coating, a polyurethane coating or a paraxylene coating. A typical polymer coating 92 is a hydrophobic polymeric coating while the coating forming material 201 includes —CF3 based perfluoro compounds, perfluorinated alkenes, hydrogen containing unsaturated compounds, optionally substituted alkynes, polyether substituted alkenes, organic compounds comprising two double bonds, saturated organic compounds having an optionally substituted alkyl chain of at least 5 carbon atoms optionally interposed with a heteroatom, macrocycles containing at least one heteroatom.

The coating forming material 201 can be a monomer of a single molecule, an oligomer, or a combination thereof. As an example, the oligomer can be a bipolymer such as Parylene C and Parylene N. As an example of the coating forming material 201, the monomer is a mixture of one or more monofunctional unsaturated fluorinated compounds and one or more polyfunctional unsaturated hydrocarbon derivatives. The monofunctional unsaturated fluorinated compounds include, but not limited to 3-(perfluoro-5-methylhexyl)-2-hydroxypropyl methacrylate, 2-(perfluorodecyl) ethyl methacrylate, 2-(perfluorohexyl)ethyl methacrylate, 1,1,2,2-Tetrahydroperfluorotetradecyl acrylate, 1H, 1H, 2H, 2H-Heptadecafluorodecyl acrylate, 1H, 1H, 2H, 2H-Perfluorooctylacrylate, 2-(Perfluorobutyl)ethyl acrylate, (2H-perfluoropropyl)-2-acrylate, (perfluorocyclohexyl)methyl acrylate, 3,3,3-trifluoro-1-propyne, 1-ethynyl-3,5-difluorobenzene and 4-ethynyl-trifluorotoluene. The polyfunctional unsaturated hydrocarbon derivative includes, but not limited to, ethoxylated trimethylolpropane triacrylate, tripropylene glycol diacrylate, divinylbenzene, poly(ethylene glycol) diacrylate, 1,6-hexanediol diacrylate, ethylene glycol diacrylate, diethylene glycol divinyl ether and neopentyl glycol diacrylate.

As another example, the polymer coating 92 is formed on the surface 91 of the substrate 90 to protect the surface 91 from chemical corrosion and enhance hydrophobic performance. More specifically, the monomer has a structure represented by the following formula:

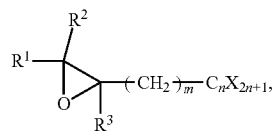

wherein R1, R2, and R3 are hydrophobic groups and are independently selected from hydrogen, alkyl, halogen, or haloalkyl, wherein m is an integer from 0-8, n is an integer from 1-15, X is selected from hydrogen or halogen, and as an example, X is fluorine.

Figure 2C:
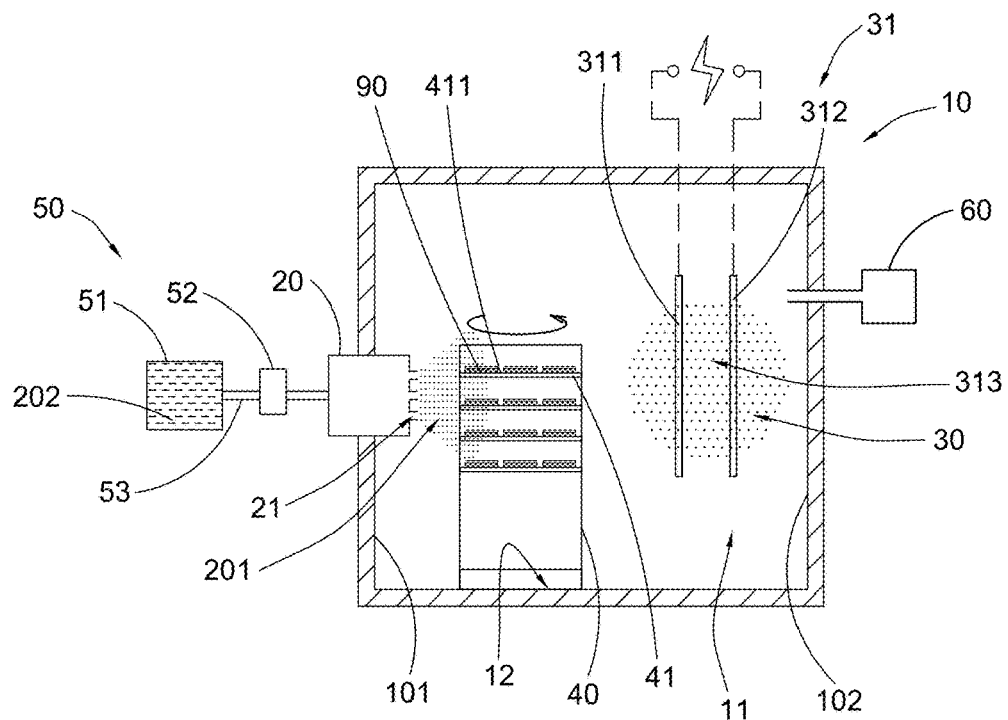
FIG. 2C is a schematic view illustrating the coating apparatus according to an alternative mode of the above first preferred embodiment of the present invention.

Referring to FIG. 2C of the drawings, an alternative mode of the coating apparatus according to the above first preferred embodiment is illustrated. The supporting rack 40 is movable in the reaction chamber 11 of the chamber body 10. As a specific example, the supporting rack 40 is operable to rotate about a central axis thereof, so that a position of the substrate 90 in the reaction chamber 11 is adjusted, so as to adjust a distance between the substrate 90 and the plasma generation source 30 and to adjust a distance between the substrate 90 and the monomer discharge source 20, so as to control and adjust a composition of a formed polymer material which is deposited on the surface 91 of the substrate 92.

Figure 2D:
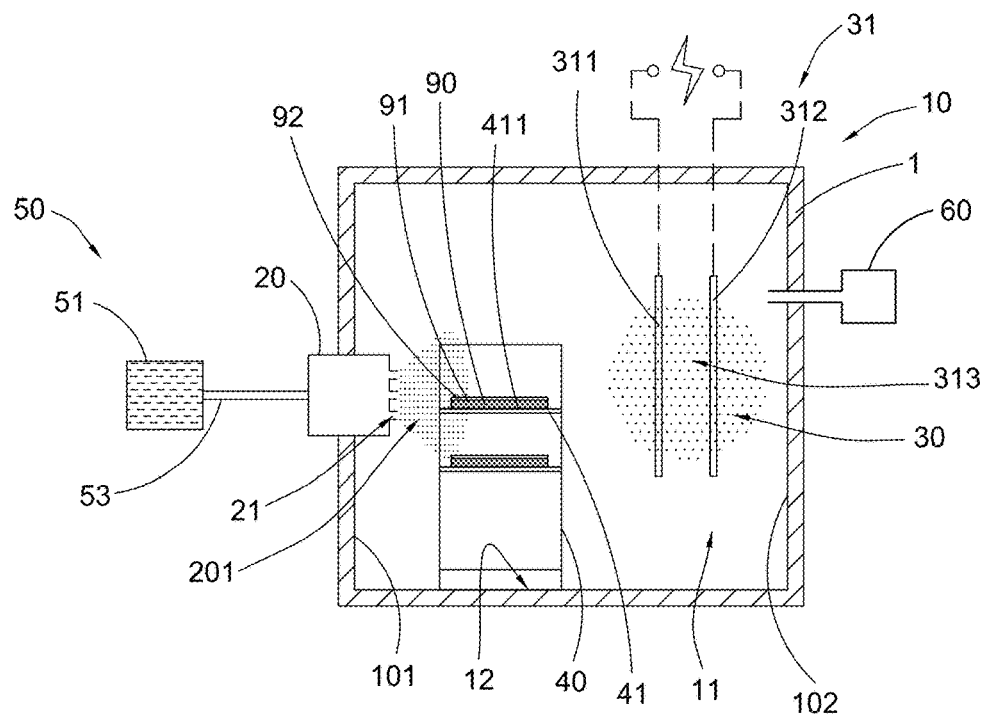
FIG. 2D is a schematic view illustrating the coating apparatus according to another alternative mode of the above first preferred embodiment of the present invention.

Referring to FIG. 2D of the drawings, another alternative mode of the coating apparatus according to the above first preferred embodiment is illustrated. In this embodiment, the monomer supply unit 50 comprises a material storage member 51 for storing a gaseous raw material of the coating forming material 201, and no vaporizer is required. In other words, the coating forming material 201 is stored in the material storage member 51 and is directly fed to the monomer discharge source 20 through the delivering tube system 53.

As an example, the coating apparatus of this preferred embodiment can be used to form a DLC (Diamond-Like Carbon) film on the surface 91 of the substrate 90. The coating forming material 201 mainly consisting of a gaseous hydrocarbon is directly introduced into the reaction chamber 11 to implement the PECVD process.

Accordingly, the present invention provides a coating method for coating the substrate 90 by the coating apparatus, and the coating method comprises the following steps.

(a) Arrange the substrate 90 in the reaction chamber 11 of the chamber body 10 at a position between the monomer discharge source 20 and the plasma generation source 30.

(b) Introduce the coating forming material 201 into the reaction chamber 11 through the monomer discharge source 20 to implement a PECVD process for forming the polymer coating 92 on the surface 91 of the substrate 90 in the effect of the plasma generation source 30.

The step (a) may comprise a step of placing one or more substrates 90 at the substrate positioning area 12 of the chamber body, wherein the monomer discharge source 20 and the plasma generation source 30 are respectively provided at two sides of the one or more substrates 90.

Alternatively, the step (a) may comprise the steps of placing one or more substrates 90 on a supporting rack 40 and placing the supporting rack 40 with the substrates 90 at the substrate positioning area 12 of the chamber body, wherein the monomer discharge source 20 and the plasma generation source 30 are respectively provided at two sides of the supporting rack 40.

Alternatively, the step (a) may comprise the steps of configuring the supporting rack 40 in the reaction chamber 11 at the substrate positioning area 12 of the chamber body 10 and loading one or more substrates 90 on the supporting rack 40, wherein the supporting rack 40 can be mounted and secured in the chamber body 10, or is just placed in the reaction chamber 11.

It is worth mentioning that the one or more substrates 90 can be horizontally, inclinedly, or vertically placed in the reaction chamber 11 of the chamber body 10.

In the step (a), the coating method comprises a step of spacedly arranging the monomer discharge source 20 and the plasma generation source 30 in the reaction chamber 11 at two opposite sides of the reaction chamber 11 of the chamber 10 and positioning one or more substrates 90 in a flowing path of the coating forming material 201 from the monomer discharge source 20 to the plasma generation source 20 in such a manner that at least a portion of the coating forming material 201 has to pass through the substrate positioning area 12 which is placed with the substrates 90 before reaching to the plasma generation source 30.

The step (b) may comprise steps of vaporizing the raw material 202 to form the coating forming material 201 which is a monomer vapor and delivering the coating forming material 201 to the monomer discharge source 20 for feeding the coating forming material 201 into the reaction chamber 11 of the chamber body 10. Accordingly, the coating forming material 201 can be pumped into the reaction chamber 11, or drawn into the reaction chamber 11 as a result of a reduction of pressure in the reaction chamber 11.

The step (b) may comprise a step of supplying the coating forming material 201 which is a gaseous monomer to the monomer discharge source 20 for feeding the coating forming material 201 into the reaction chamber 11 of the chamber body 10.

According to this preferred embodiment, in the step (b), as shown in FIG. 2B of the drawings, the coating forming material 201 is dispersed through the monomer discharge source 20 into the chamber body 11 towards the plasma generation source 30. For example, the coating forming material 201 is horizontally injected into the chamber body 11 towards the plasma generation source 30, but the supporting rack 40 is arranged between the monomer discharge source 20 and the plasma generation source 30, the coating forming material 201 is not required to pass through the plasma generation source 30 before reaching to the substrate 90 for plasma processing the substrate 90, so that not all of the coating forming material 201 is activated and excited by the plasma generation source 30.

Figure 3A:
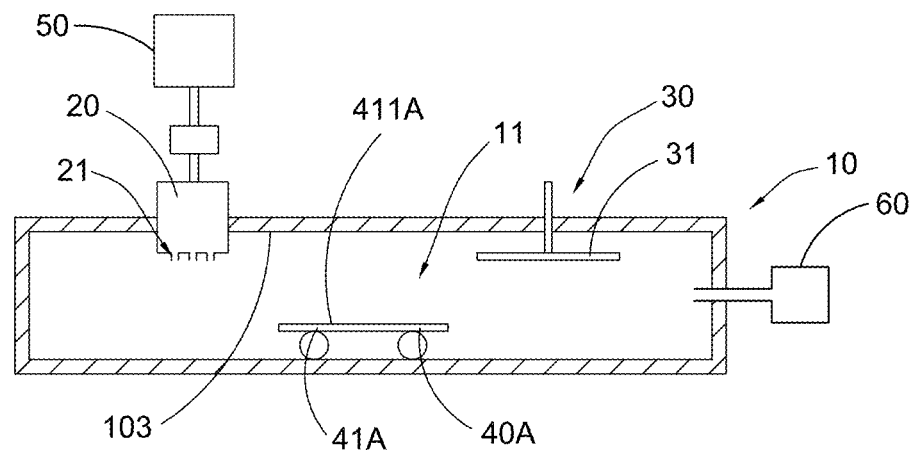
FIG. 3A is a schematic view of a coating apparatus according to a second preferred embodiment of the present invention.
Figure 3B:
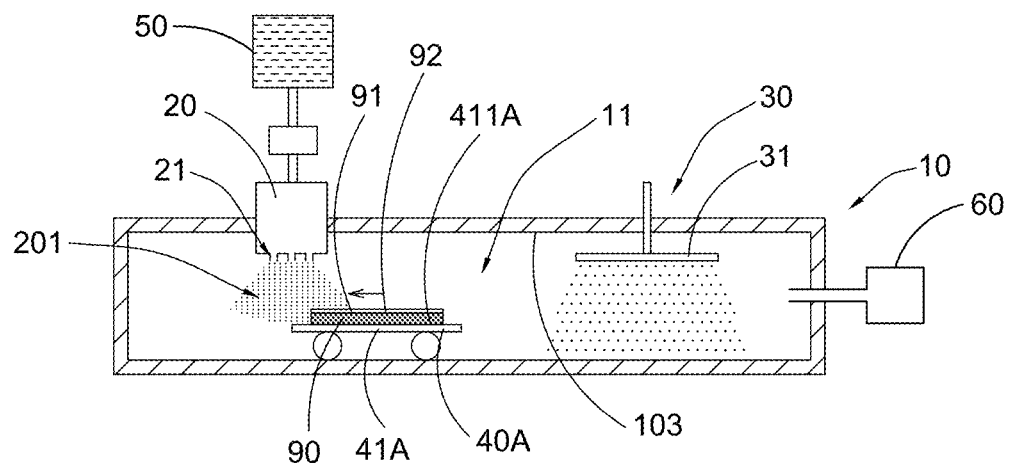
FIGS. 3B and 3C are schematic views illustrating a supporting rack which is carrying the substrate and moving between a monomer discharge source and a plasma generation source of the coating apparatus according to the above second preferred embodiment of the present invention.
Figure 3C:
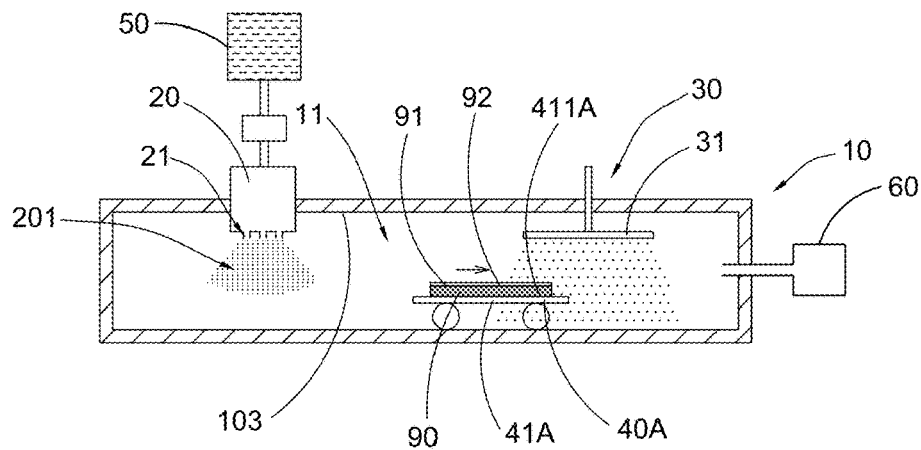

Referring to FIG. 3A to FIG. 3C of the drawings, a coating apparatus according to a second preferred embodiment of the present invention is illustrated. The coating apparatus of this preferred embodiment comprises a chamber body 10 having a reaction chamber 11, a monomer discharge source 20 for discharging a gaseous coating forming material 201 into the reaction chamber 11 of the chamber body 10, a plasma generation source 30 remotely from the monomer discharge source 20 operable to activate and excite the coating forming material 201, and a supporting rack 40A for supporting and carrying a substrate 90 on a supporting area 411A, so that when the plasma generation source 30 is in operation and a coating forming material 201 is fed into the reaction chamber 11, the substrate 90 is exposed to a plasma generated by the plasma generation source 30 to allow a polymer coating 92 to be deposited and formed on a surface 91 of the substrate 90.

According to this preferred embodiment, the supporting rack 40A is embodied as a movable supporter that is movable in the reaction chamber 11 of the chamber body 10.

Particularly, the supporting rack 40A is movable between the monomer discharge source 20 and the plasma generation source 30. A movement manner of the supporting rack 40 can be, but not limited to, a linear movement, a curvilinear movement, a sliding movement or a rotating movement, so that a position of the substrate 90 in the reaction chamber 11 is adjusted, so as to adjust the amount of the monomer and the decomposed precursors which are deposited on the substrate 90 so as to increase a quality of the formed polymer coating 92 on the surface 91 of the substrate 90. In some embodiments, the movement of the supporting rack 40A provides a substantial same plasma polymerization environment for a plurality of the substrates 90, so as to enhance a uniformity of the formed polymer coatings 92 on the substrates 90.

The movement of the supporting rack 40A may be configured for producing a relative displacement between the substrate 90 and the monomer discharge source 30, or producing a relative displacement between the substrate 90 and the plasma generation source 30, or for producing both of the above mentioned relative displacements, so that an amount of the monomer which is not excited by the plasma generation source 30, or an amount of the reactive precursor species produced by breaking down the monomer, reaching to the substrate 90 can be adjusted, so as to ensure suitable and adequate reactions of the monomer and the reactive precursor species.

It is worth mentioning that the movement of the supporting rack 40A can be controlled by a control unit which is programmed to adjust a moving manner, a moving time interval, or a moving speed of the supporting rack 40A, so as to provide a desired plasma polymerization environment for the substrate 90 to obtain desired branching and cross-linking in a molecular structure of the polymer coating 92 and form the polymer coating 92 with a relatively high quality.

According to this preferred embodiment, as shown in FIG. 3A to 3C of the drawings, the supporting rack 40A is embodied as a movable supporter that is capable of repeatedly moving between the monomer discharge source 20 and the plasma generation source 30, so as to adjust the distance between the substrate 90 and the monomer discharge source 20, as well as the distance between the substrate 90 and the plasma generation source 30.

As a specific example, the chamber body 10 has a rectangular reaction chamber 11, the monomer discharge source 20 and the plasma generation source 30 can be arranged at a same side wall of the chamber body 10 and are spacedly apart from each other. For example, the monomer discharge source 20 and the plasma generation source 30 are arranged at a top side wall 103 of the chamber body 10. During the plasma polymerization coating method, the monomer discharge source 20 discharges the coating forming material 201, and a monomer area is defined in front of the monomer discharge source 20, the plasma generation source 30 is in operation for creating a plasma generation area around it, the supporting rack 40A is moving back and forth between the monomer area and the plasma area.

As shown in the drawings, in this preferred embodiment, the coating forming material 201 is not dispersed into the reaction chamber 11 through the monomer discharge source 20 towards the plasma generation source 30, but can be transversely introduced into the reaction chamber 11, and then is longitudinally dispersing towards the substrate 90 and the plasma generation source 30, so that the gaseous flow of the coating forming material 201 discharged through the monomer discharge source 30 will not directly blow the plasma generated around the plasma generation source 30, rendering a desired mixing performance of the monomer and the reactive precursor species which are broken down from the monomer.

The person of ordinary skilled in the art will understand that the supporting rack 40A, which is operable to move between the monomer discharge source 20 and the plasma generation source 30, can be driven by an electric motor, a pneumatically driving system, or a hydraulic driving system. The chamber body 10 can be provided with guiding rails or guiding grooves for retaining the supporting rack 40A in position, as well as for guiding and restricting the movement of the supporting rack 40A.

As shown in the drawings, the electrode means 31 of the plasma generation source 30 of this preferred embodiment is desired to be constructed to be a planar electrode which is extending in the reaction chamber 11, other electrode means for creating the electric field also can be adopted.

Accordingly, this preferred embodiment of the present invention provides a coating method for depositing the polymer coating 92 on the surface 91 of the substrate 90, and the coating method comprises the following steps.

(A) Feed the coating forming material 201 into the reaction chamber 11 of the chamber body 10 through the monomer discharge source 20 which is remotely from the plasma generation source 30.

(B) Move the substrate 90 between the monomer discharge source 20 and the plasma generation source 30.

(C) Activate the plasma generation source 30 to plasma process the substrate 90 for forming the polymer coating 92 on the surface 91 of the substrate 90.

It should be noted that the step sequence of the above steps (A), (B) and (C) is not limited. In the step (B), the step may comprise the steps of carrying the substrate 90 on a supporting rack 40A and driving the supporting rack 40A to repeatedly move back and forth between the monomer discharge source 20 and the plasma generation source 30. More specifically, as a preferred example, the supporting rack 40A is driven to move to adjust the distance between the substrate 90 and the monomer discharge source 20, as well as the distance between the substrate 90 and the plasma generation source 30.

Figure 4A:
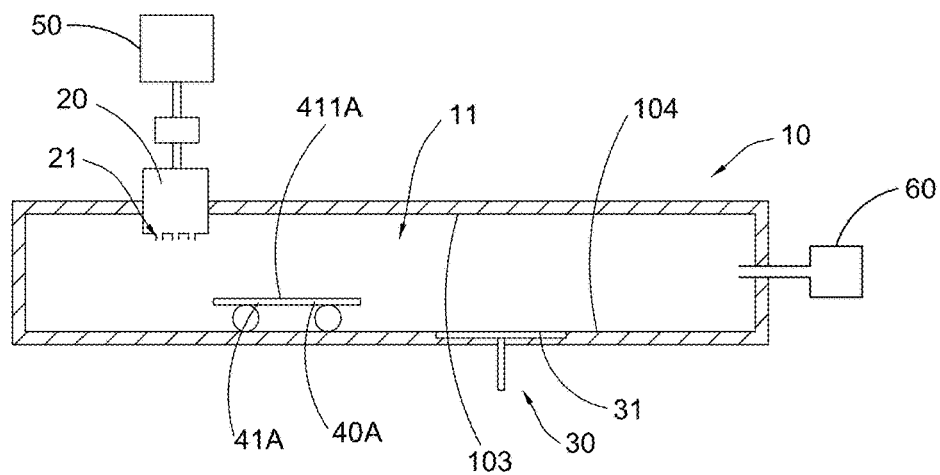
FIG. 4A is a schematic view of the coating apparatus according to an alternative mode of above second preferred embodiment of the present invention.
Figure 4B:
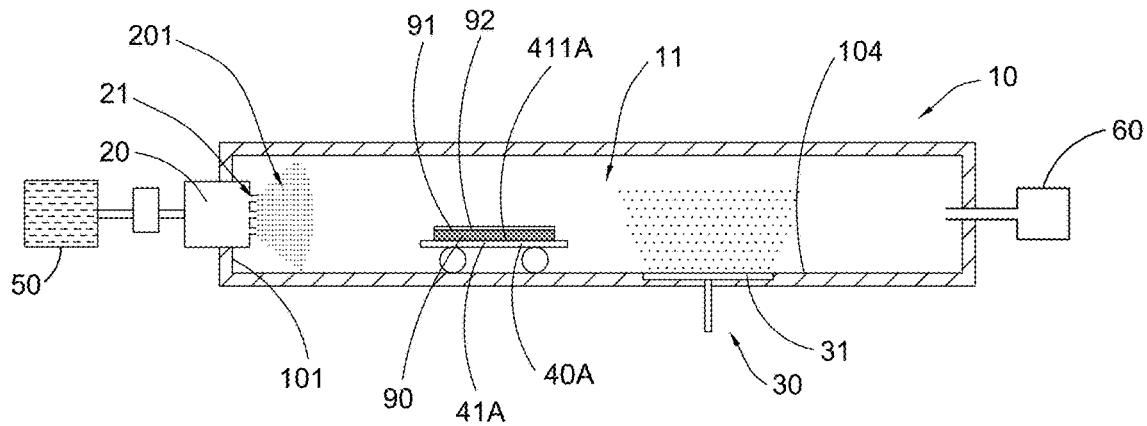
FIG. 4B is a schematic view of the coating apparatus according to another alternative mode of above second preferred embodiment of the present invention.

Referring to FIG. 4A of the drawings, as an alternative mode, the monomer discharge source 20 and the plasma generation source 30 may be arranged adjacent to two opposite side walls of the chamber body 10. For example, the monomer discharge source 20 is arranged adjacent to a top side wall 103 while the plasma generation source 30 is mounted to a bottom side wall 104 of the chamber body 10. As shown in FIG. 4B of the drawings, as another alternative mode, the monomer discharge source 20 may be arranged adjacent to at an end side wall 101 of the chamber body 10 for discharging the coating forming material 201 towards the substrate 90 while the plasma generation source 30 may be arranged at a bottom wall 104 of the chamber body 10. In other words, the monomer discharge source 20 and the plasma generation source 30 can be arranged at adjacent side walls 101 and 104 of the chamber body 10.

Figure 5A:
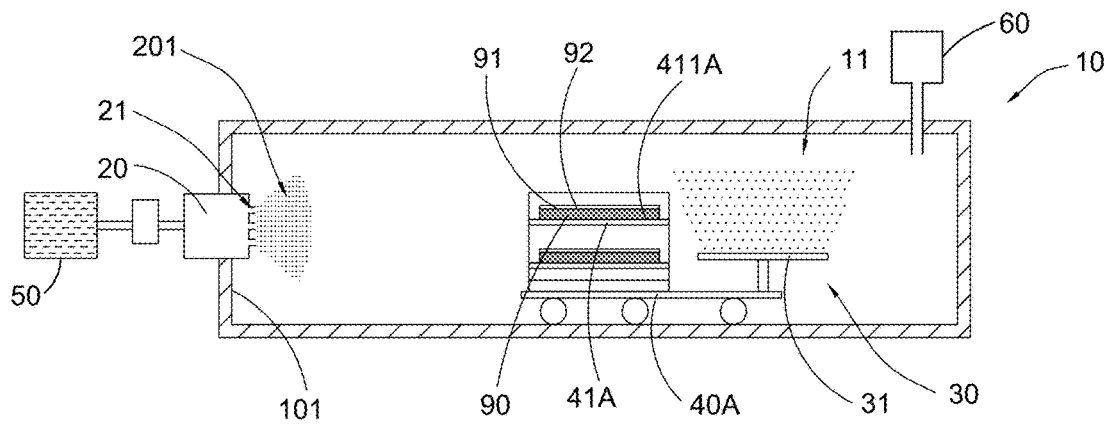
FIGS. 5A and 5B are schematic views illustrating a supporting rack which is mounted with the plasma generation source and is carrying the substrate moving between a monomer discharge source and a plasma generation source of the coating apparatus according to another alternative mode of the above second preferred embodiment of the present invention.
Figure 5B:
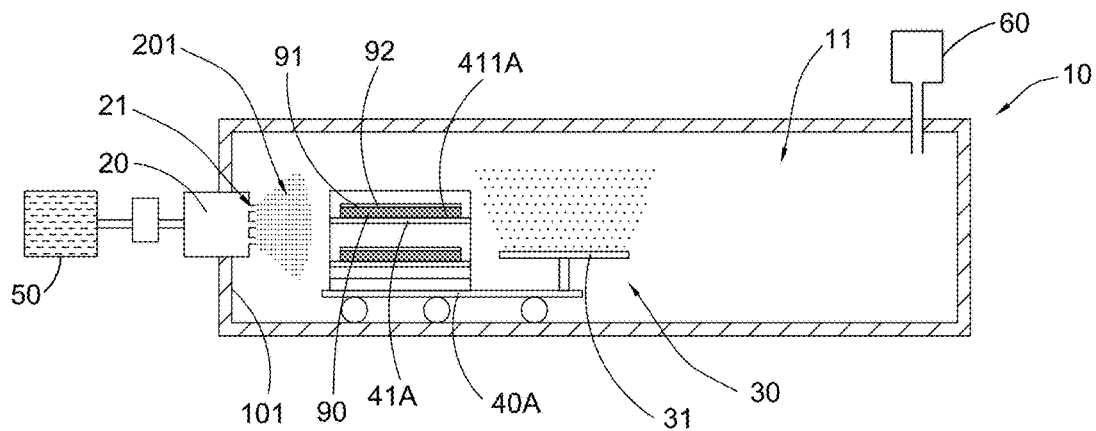

Referring to FIG. 5A and FIG. 5B of the drawings, as still another alternative mode of the above preferred embodiment, the plasma generation source 30 can be mounted to the supporting rack 40A at a side which is opposite to the monomer discharge source 20. The supporting rack 40A is immovable, or preferably, the supporting rack 40A is configured to be movable to adjust the distance between the supporting rack 40A and the monomer discharge source 20, and the distance between the monomer discharge source 20 and the plasma generation source 30 is also adjusted. According to this preferred embodiment, the relative position between the substrate 90 and the plasma generation source 30 can be fixed, but the plasma generation source 30 can move along with the supporting rack 40A to change the plasma creating environment within the reaction chamber 11 of the chamber body 10.

Figure 6A:
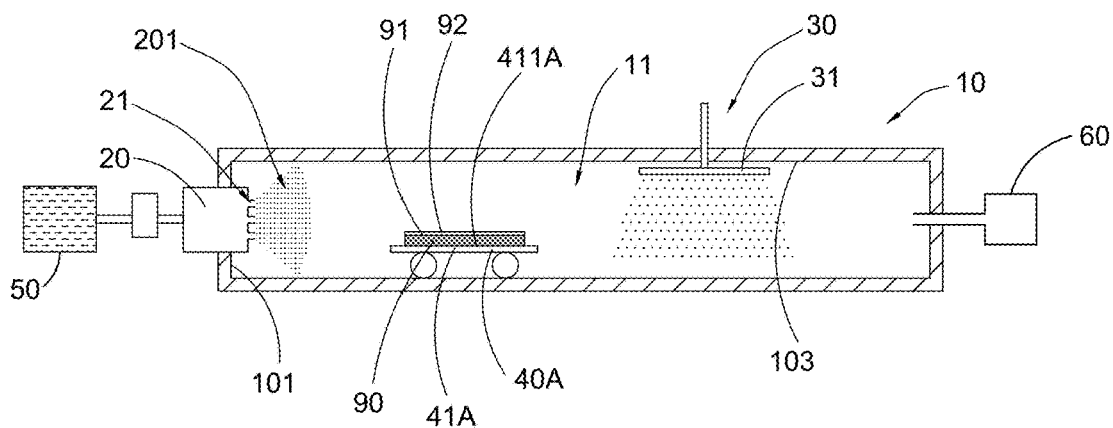
FIGS. 6A and 6B are schematic views illustrating a supporting rack which is carrying the substrate moving close to or away from a plasma generation source of the coating apparatus according to another alternative mode of the above second preferred embodiment of the present invention.
Figure 6B:
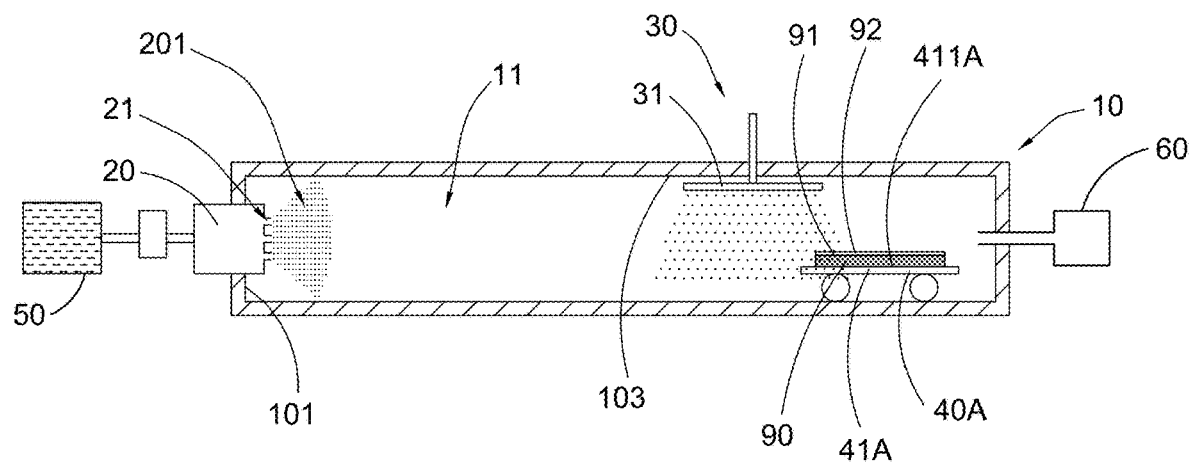

Referring to FIG. 6A and FIG. 6B of the drawings, another alternative mode of the coating apparatus is illustrated. In this embodiment, the person of ordinary skilled in the art should understand that the supporting rack 40A may also move to a position in such a manner that the plasma generation source 30 is located between the monomer discharge source 20 and the substrate 90. However, during the movement of the supporting rack 40A between the monomer discharge source 10 and the plasma generation source 30, the coating forming material 201 has to pass through the supporting rack 40A before reaching to the plasma generation source 30, so that not all of the coating forming material 201 is required to pass through the plasma generation source 30 before reaching to the substrate 90.

In other words, this preferred embodiment provides a coating method for depositing the polymer coating 92 on the surface 91 of the substrate 90 comprising the followings steps.

Move the substrate 90 in the reaction chamber 11 of the chamber body 10 defining a moving path of the substrate 90, wherein during at least a proportion of the moving path, the substrate 90 is located at a position between the monomer discharge source 20 and the plasma generation source 30.

Discharge the coating forming material 201 into the reaction chamber of the chamber body 10 to activate the plasma process of the substrate 90 during the operation of the plasma generation source 30.

Accordingly, the moving path of the substrate 90 can be divided a first proportion in which the monomer discharge source 20 and the plasma generation source 30 are respectively located at two sides of the substrate 90 and a second proportion in which the monomer discharge source 20 and the substrate 90 are respectively located at two sides of the plasma generation source, and the first portion of the moving path can be significantly larger than the second portion of the moving path of the substrate 90 which is carried by the supporting rack 40A.

Figure 7:
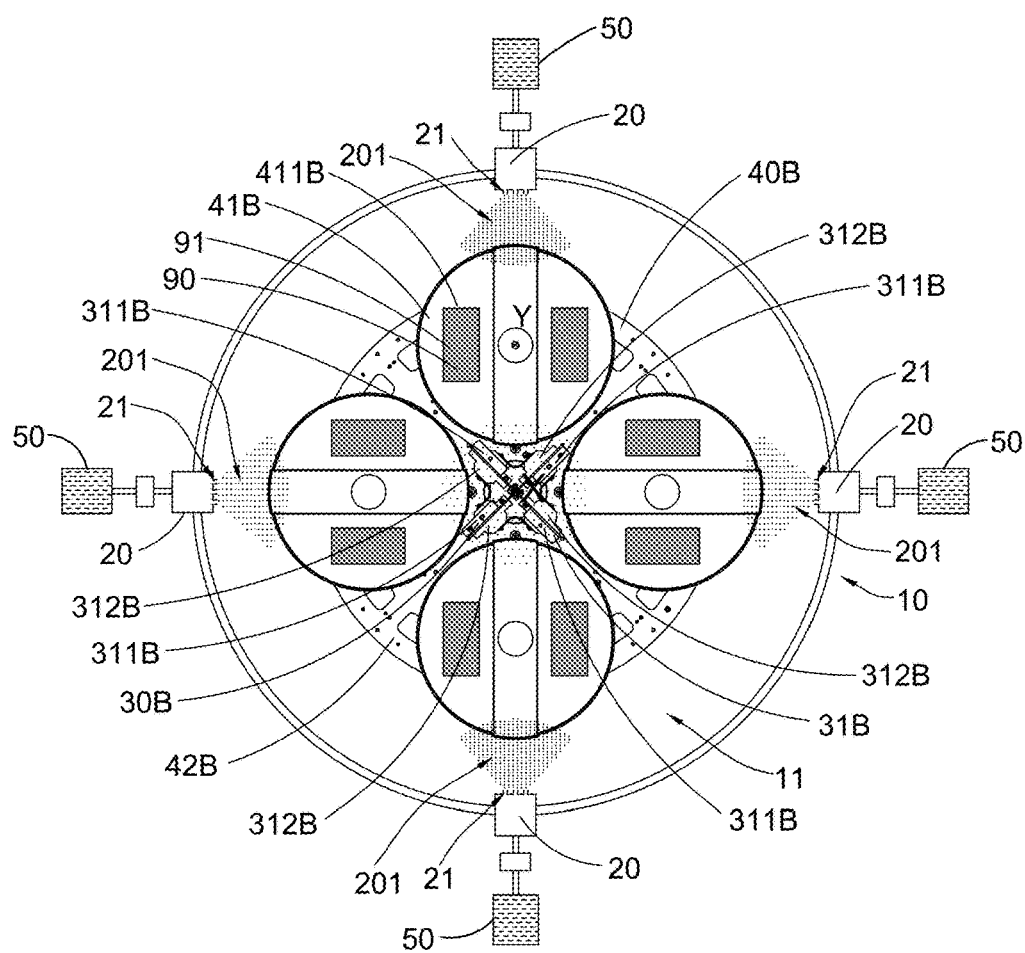
FIG. 7 is a schematic view of a coating apparatus according to a third preferred embodiment of the present invention.

Referring to FIG. 7 of drawings, a coating apparatus according to a third preferred embodiment of the present invention is illustrated. More specifically, the coating apparatus of this preferred embodiment comprises a chamber body 10 having a reaction chamber 11, one or more monomer discharge sources 20 for discharging a gaseous coating forming material 201 into the reaction chamber 11 of the chamber body 10, a plasma generation source 30B for exciting the coating forming material 201, and a supporting rack 40B for supporting and carrying a substrate 90, so that when the plasma generation source 30B is in operation and a coating forming material 201 is fed into the reaction chamber 11 through the one or more monomer discharge sources 20, a polymer coating 92 is deposited and formed on a surface 91 of the substrate 90.

According to this preferred embodiment, the plasma generation source 30B is arranged at a substantial central area of the supporting rack 40B. Preferably, the plasma generation source 30B can be arranged at the center of the reaction chamber 11 of the chamber body 10 while a plurality of substrates 90 which is to be coated with the polymer coating 92 is adapted for being arranged around the plasma generation source 30B to encircle the plasma generation source 30B, so that each substrate 90 is adapted for being arranged between the plasma generation source 30B and the monomer discharge source 20.

More specifically, a plurality of monomer discharge sources 20, such as four monomer discharge sources 20, can be arranged at positions adjacent to an inner wall of the chamber body 10, and coating forming material 201 can be discharged at positions adjacent to an inner perimeter of the chamber body 10 and flow towards the plasma generation source 30B at the central position of the chamber body 10. Since the plurality of monomer discharge sources 20 and the plasma generation source 30B are provided at two opposite sides of the substrate 90, excessive decomposition of the coating forming material 201 is prevented.

The plasma generation source 30B of this preferred embodiment of the present invention comprises an electrode means 31B for applying an electric power to the coating forming material 201 discharged into the chamber body 10. More specifically, as an example, the electrode means 31B comprises at least one pair of electrodes, preferably, a plurality of pairs of first electrode 311B and second electrode 312B are provided at the center of the reaction chamber 11. As shown in FIG. 7 of the drawings, each of the first electrodes 311B and second electrodes 312B can be embodied as an elongated electrode plate vertically arranged in the reaction chamber 11 of the chamber body 10. In this exemplifying embodiment, four first electrodes 311B and four second electrodes 312B are alternatingly arranged along a circumferential direction.

The first electrodes 311B and the second electrodes 311B are positive and negative electrodes, and are respectively electrically connected to two connecting ends of an energy source such as an RF generator which is placed at an outer side of the chamber body 10. Alternatively, the first electrode 311B can be electrically connected to the energy source, and the second electrode 312B can be grounded.

The supporting rack 40B of this preferred embodiment comprises one or more carrier racks 41B for carrying one or more substrates 90. Each of the carrier racks 41B has a supporting area 411B for positioning the substrate 90 which can be horizontally, inclinedly, and vertically placed at the carrier area 411B. In this embodiment, the substrate 90 can be horizontally placed at the supporting area 411B and is retained and supported by the supporting area 411B.

According to this preferred embodiment, a plurality of supporting areas 411B of one or more carrier rack 41B is arranged between the plasma generation source 30B and the monomer discharge source 20, so that when one or more substrates 90 are placed at the corresponding supporting area 411B, the monomer discharge source 20 and the plasma generation source 30B are respectively arranged at two opposite sides of each corresponding substrate 90.

Furthermore, each of the carrier racks 41B of the supporting rack 40B of this preferred embodiment can carry a plurality of the substrates 90 and is movable in the reaction chamber 11, and the movement of each of the carrier racks 41B can be, but not limited to, a linear movement, a curvilinear movement, a sliding movement, and a rotation movement. As a specific example of this preferred embodiment, each of the carrier racks 41B of the supporting rack 40B is operable to rotate about a central axis Y thereof.

The supporting rack 40B of this preferred embodiment further comprises a movable rack 42B for supporting the one or more carrier racks 41B. The movement of the movable rack 42B also can be, but not limited to, a linear movement, a curvilinear movement, a sliding movement, and a rotation movement.

According to this preferred embodiment, the movable rack 42B is functioning as a rotation rack that is operable to rotate about a central axis X within the reaction chamber which is embodied as a circular chamber, and since the carrier racks 41B are supported on the movable rack 42B, each of the carrier racks moves along with the movable rack 42B while simultaneously self-rotate with respect to its central axis Y, so that two types of the movements of the carrier racks 41B change the relative position between each of the substrates 90 and the plasma generation source 30.

Referring to FIGS. 8A to 8E of the drawings, as an alternative mode of the above third preferred embodiment of the present invention, the coating apparatus comprise a plasma generation source 30C which comprises an electrode means 31C. The electrode means 31C of this preferred embodiment comprises a first electrode 311C and a second electrode 312C each of which is embodied as a cylindrical electrode, the first electrode 311C is sleeved around the second electrode 312C to define a circular discharge field 313C between the first electrode 311C and the second electrode 312C. The first electrode 311C can be electrically connected to an energy source such as an RF generator, and the second electrode 312C can be grounded.

In addition, the first electrode 311C can be embodied as a porous electrode having a plurality of holes that communicates the discharge field 313C to the reaction chamber 11, and the second electrode 312C is formed as an elongated tube having communicating holes which are communicated with the reaction chamber 11, so that it may further function as a gas extracting tube communicated to an outer side of the reaction chamber 11 of the chamber body 10 for extracting the gaseous mixture out of the reaction chamber 11 of the chamber body 10, so as to adjust the pressure within the reaction chamber 11 as well as to remove the tail gas in the reaction chamber 11.

As shown in FIGS. 8B to 8E of the drawings, the coating apparatus of this alternative mode of the preferred embodiment comprises the chamber body 10 having the reaction chamber 11, one or more monomer discharge sources 20 for discharging a gaseous coating forming material 201 into the reaction chamber 11 of the chamber body 10, the plasma generation source 30C for exciting the coating forming material 201, and a supporting rack 40C for supporting and carrying a plurality of substrates 90, so that when the plasma generation source 30C is in operation and a coating forming material 201 is fed into the reaction chamber 11 through the one or more monomer discharge sources 20, a polymer coating 92 is deposited and formed on a surface 91 of each substrate 90.

The supporting rack 40C of this alternative mode of the preferred embodiment comprises one or more carrier racks 41C for carrying the substrates 90 and a movable rack 42C for supporting the one or more carrier racks 41C. Each of the carrier racks 41C comprises a plurality of carrier platforms 410C which are parallel to each other and are spaced from each other, wherein each of the carrier platforms has a supporting area 411C for positing the substrates 90.

According to this alternative mode of the preferred embodiment, a plurality of the carrier platforms 410C of the carrier racks 41C is arranged between the plasma generation source 30C and the monomer discharge source 20, so that when the substrates 90 are supported at the corresponding carrier platforms 410C, the monomer discharge source 20 and the plasma generation source 30C are respectively arranged at two opposite sides of each corresponding substrate 90.

Furthermore, each of the carrier racks 41C of the supporting rack 40C of this alternative mode of the preferred embodiment can carry a plurality of the substrates 90 and is movable in the reaction chamber 11. Preferably, each of the carrier racks 41C of the supporting rack 40C is operable to rotate about a central axis Y thereof. In addition, the movable rack 42C is preferred to rotate about a central axis X thereof.

The supporting rack 40C of the coating apparatus of this alternative mode of the preferred embodiment further comprises a motion transmission arrangement 43C which comprises a first gear member 431C mounted and fixed to the movable rack 42C and a plurality of second gear members 432C mounted to the corresponding carrier racks 41C. Accordingly, when the movable rack 42C is driven by a motor to rotate about the central axis X thereof, the plurality of second gear members 432C which is respectively engaged with the first gear member 431C rotate around the first gear member 431C to drive the carrier racks 41C to rotate about the central axis Y thereof.

Figure 8A:
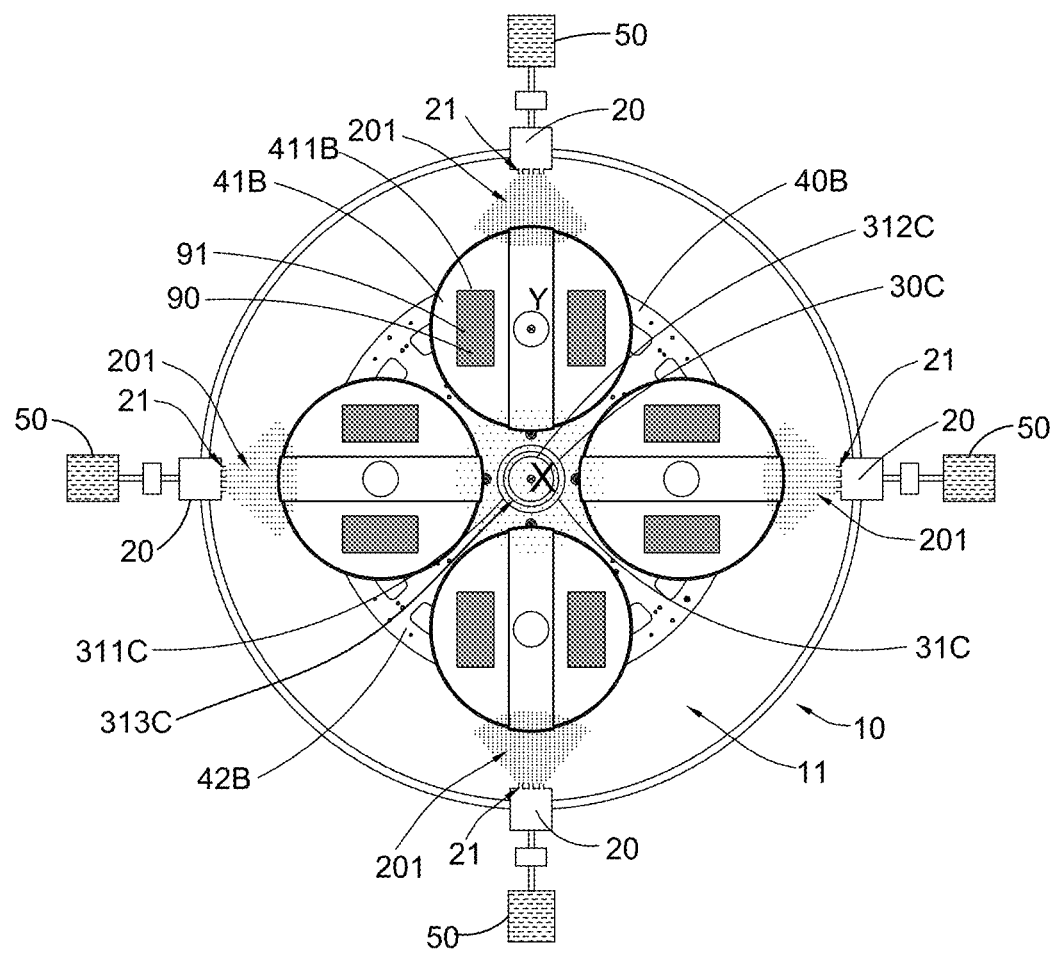
FIG. 8A is a schematic view of the coating apparatus according to an alternative mode of the above third preferred embodiment of the present invention.
Figure 8B:
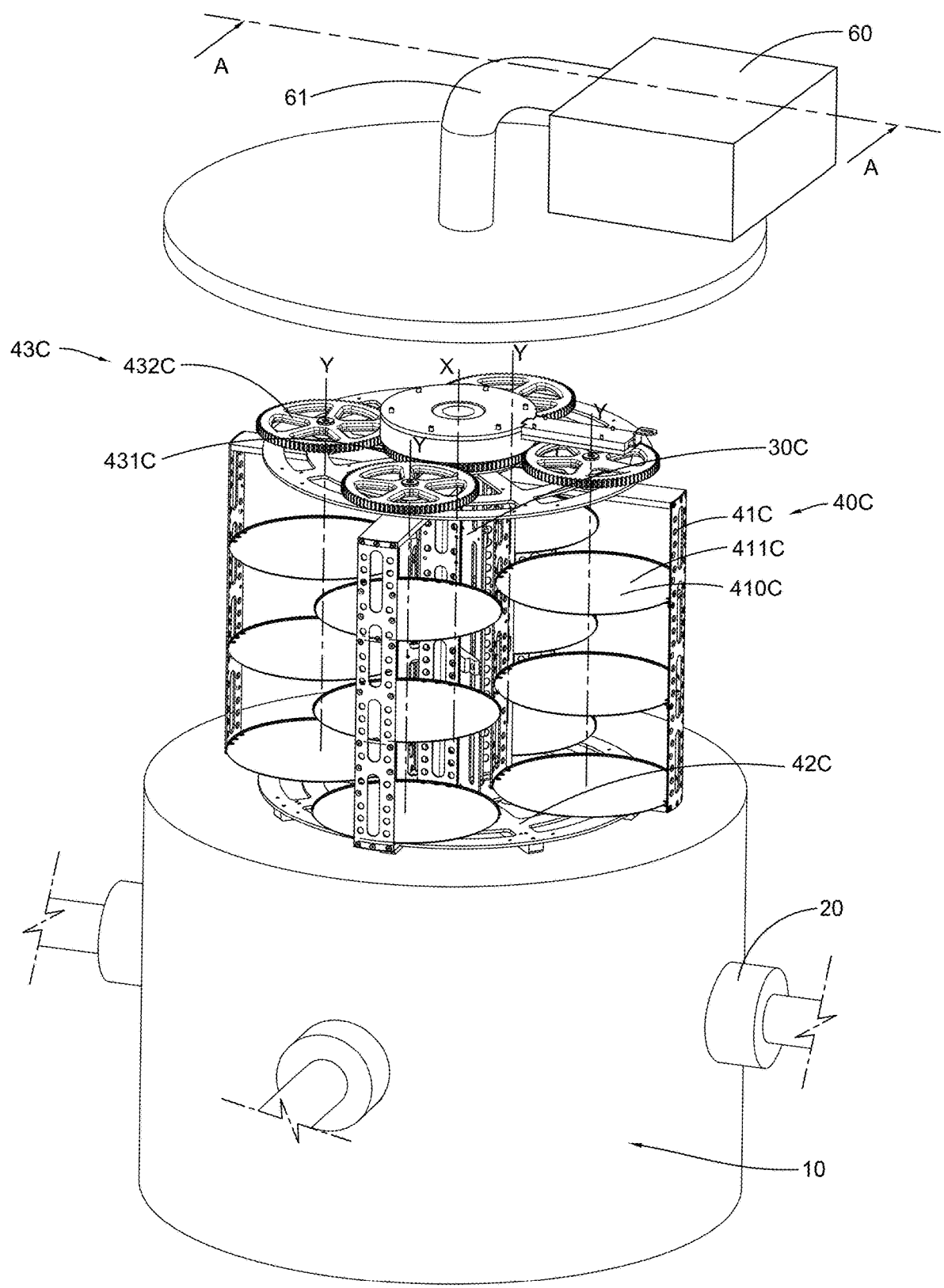
FIG. 8B is an exploded view of the coating apparatus according to the alternative mode of the third preferred embodiment of the present invention.
Figure 8C:
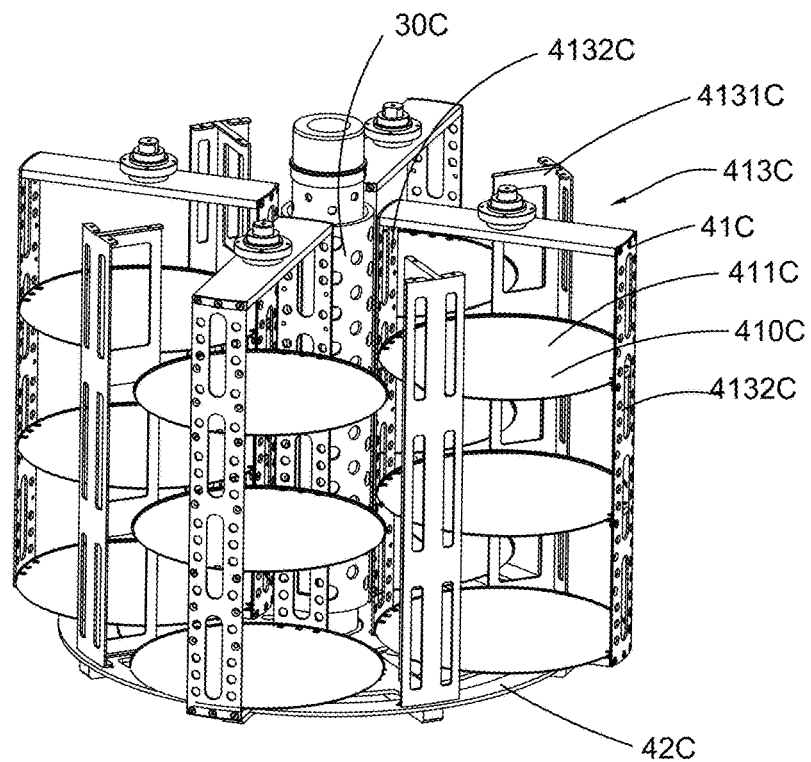
FIG. 8C is a perspective view illustrating a supporting rack and a plasma generation source of the coating apparatus according to the alternative mode of the above third preferred embodiment of the present invention.

As shown in FIGS. 8B and 8C of the drawings, each of the carrier racks 41C comprises a supporting frame 413C which comprises a top arm 4131C and two parallel side legs 4132C extended from the top arm 4131C. Each of the second gear members 432C is mounted on the top arm 4131C, and the plurality of carrier platform 410C is mounted between the two side legs 4132C.

As shown in FIGS. 8B to 8E of the drawings, each of the first and second electrodes 311C and 312C of the electrode means 31C of this alternative mode of the preferred embodiment is embodied as a cylindrical electrode, the first electrode 311C is sleeved around the second electrode 312C. The first electrode 311C can be electrically connected to an energy source such as an RF generator, and the second electrode 312C can be grounded. Or the first electrode 311C can be electrically connected to the supporting rack 40C and the supporting rack 40C is grounded, and the second electrode 312C is electrically connected to an energy source.

Electrical insulating material can be connected between the first electrode 311C and the second electrode 312C to space apart the first electrode 311C from the second electrode 312C. The second electrode 312C is electrically connected to the supporting rack 40C and the supporting rack 40C is grounded, the first electrode 311C is electrically connected to the energy source by an electrical connecting member which is biasing against the first electrode 311C and enables the rotation movement of the first electrode 311C, so that the first and second electrodes 311C and 312C can rotate along with the rotation of the supporting rack 40C.

Figure 8D:
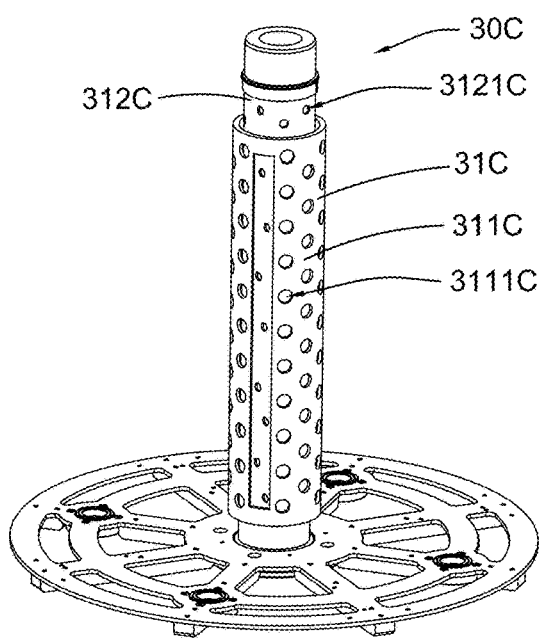
FIG. 8D is a perspective view illustrating the plasma generation source of the coating apparatus according to the alternative mode of the above third preferred embodiment of the present invention.

As shown in FIG. 8D of the drawings, the first electrode 311C has a plurality of first holes 3111C that communicates the discharge field 313C to the reaction chamber 11, and the coating forming material 201 can enter and get out of the discharge filed 313C through the holes 3111C. The second electrode 312C has a plurality of second holes 3121C communicated with the reaction chamber 11, so as to function as the gas extracting tube.

Figure 8E:
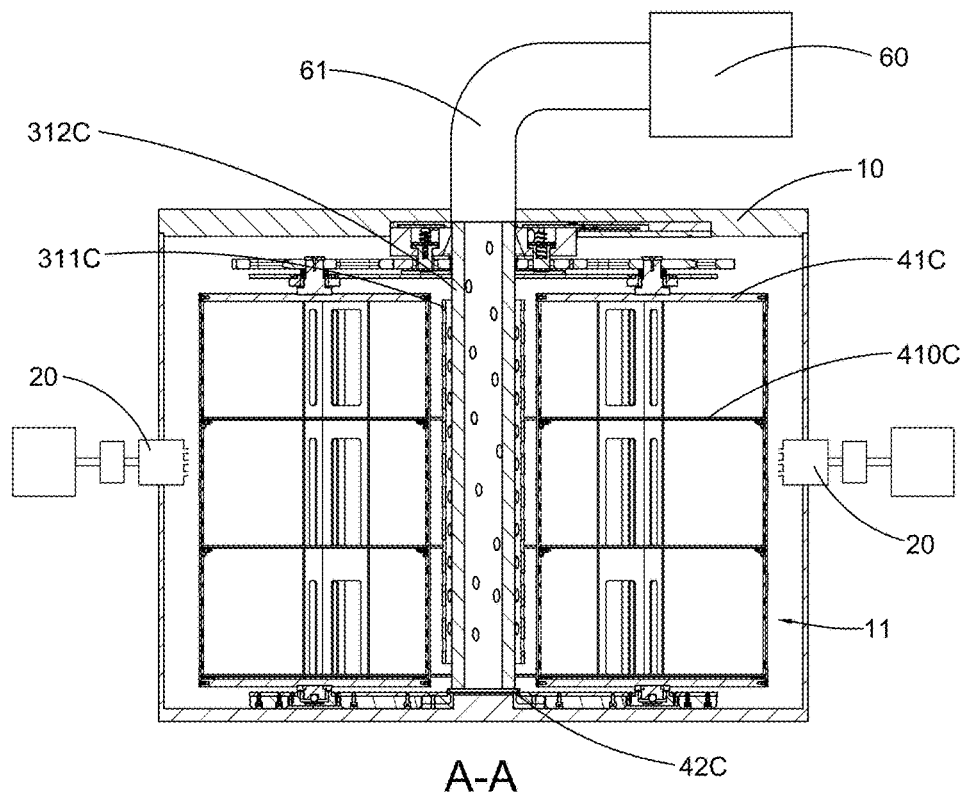
FIG. 8E is a sectional view along line A-A in FIG. 8B

The coating apparatus further comprises a pressure adjustment unit 60 which is adjacent to the plasma generation source 30C and remotely from the monomer discharge source 20 for adjusting a pressure in the reaction chamber 11 of the chamber body 10. Accordingly, the pressure adjustment unit 60 comprises a gas extracting member 61 which is coupled to the second electrode 312C which is the gas extracting tube. As shown in FIG. 8B and FIG. 8E of the drawings, the gas extracting member 61 is arranged at a position above the plasma generation source 30C.

Referring to FIGS. 9A to 9D of the drawings, according to another alternative mode of the above preferred embodiment of the present invention, the coating apparatus comprises the plasma generation source 30C and a supporting rack 40C. In this another alternative mode of the preferred embodiment, the supporting rack 40C functions as a rotation rack that is capable of rotating about its central axis X, and a plurality of substrate 90 can be directly put on the supporting rack 40C without requiring the carrier racks 41B mentioned above. The displacement of the plurality of substrates 90 is resulting from the rotation of the supporting rack 40C.

Figure 9A:
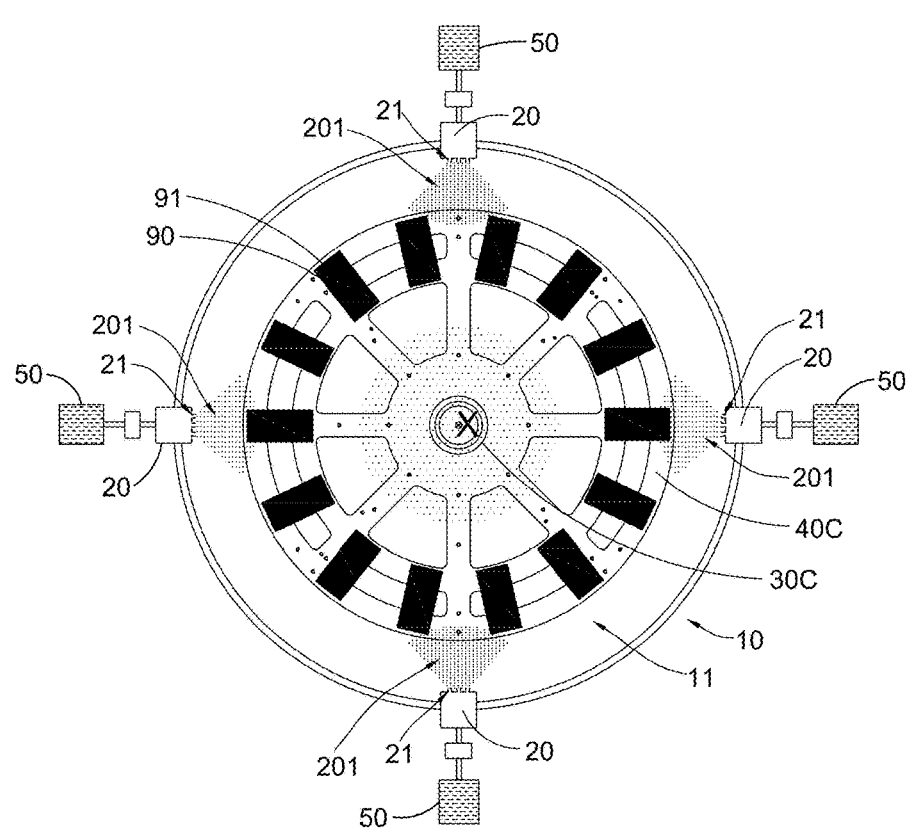
FIG. 9A is a schematic view of the coating apparatus according to another alternative mode of above third preferred embodiment of the present invention.
Figure 9B:
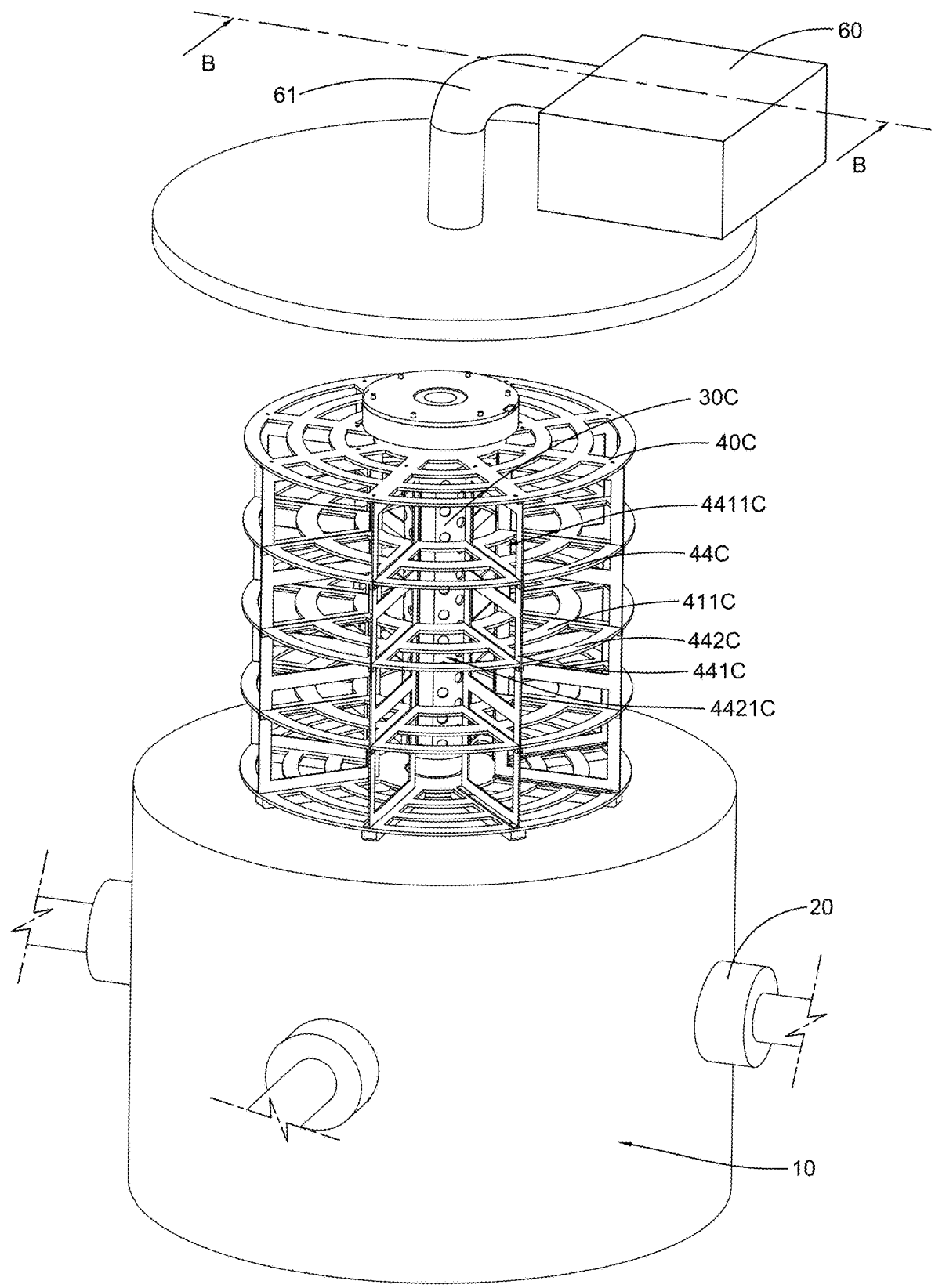
FIG. 9B is an exploded view of the coating apparatus according to the another alternative mode of the third preferred embodiment of the present invention.
Figure 9C:
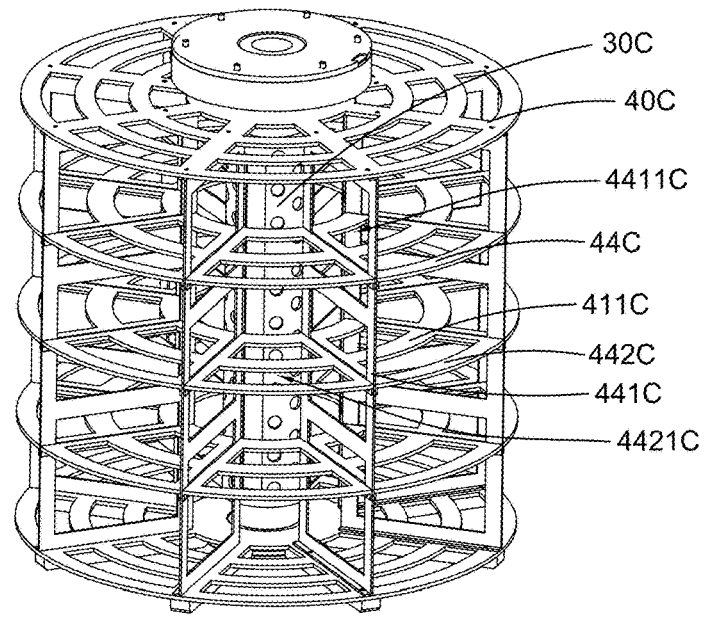
FIG. 9C is a perspective view illustrating a supporting rack and a plasma generation source of the coating apparatus according to the another alternative mode of the above third preferred embodiment of the present invention.
Figure 9D:
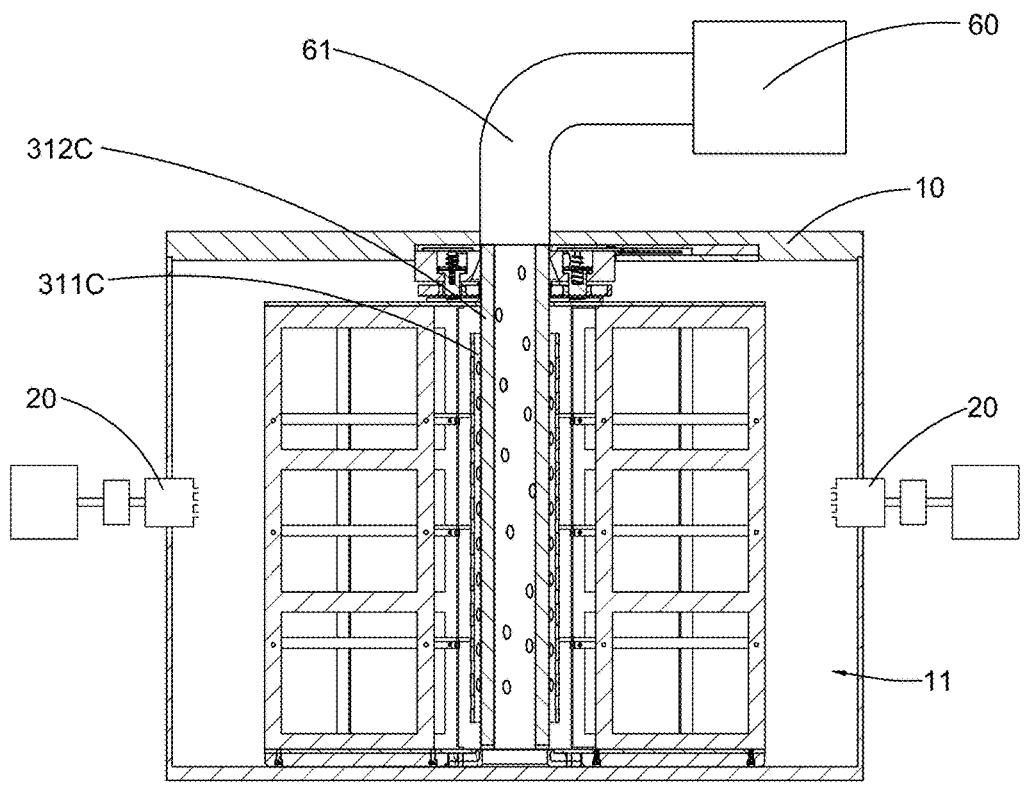
FIG. 9D is a sectional view along line B-B in FIG. 9B.

As shown in FIGS. 9B to 9D of the drawings, the supporting rack 40C comprises a rotation frame 44C which comprises a plurality of radially extending mounting frame 441C and a plurality of supporting platforms 442C each is circular in shape and connected to the mounting frames 441C. Each supporting platform 442C has the supporting areas 411C for supporting the substrates 90.

In addition, each mounting frame 441C also has a plurality of first openings 4411C, each supporting platform 442C has a plurality of second openings 4421C, so as to facilitate the monomer and the reactive precursor species to flow in the reaction chamber 11, so as to increase the evenness of the polymer coatings 92 formed on the substrates 90.

Figure 10A:
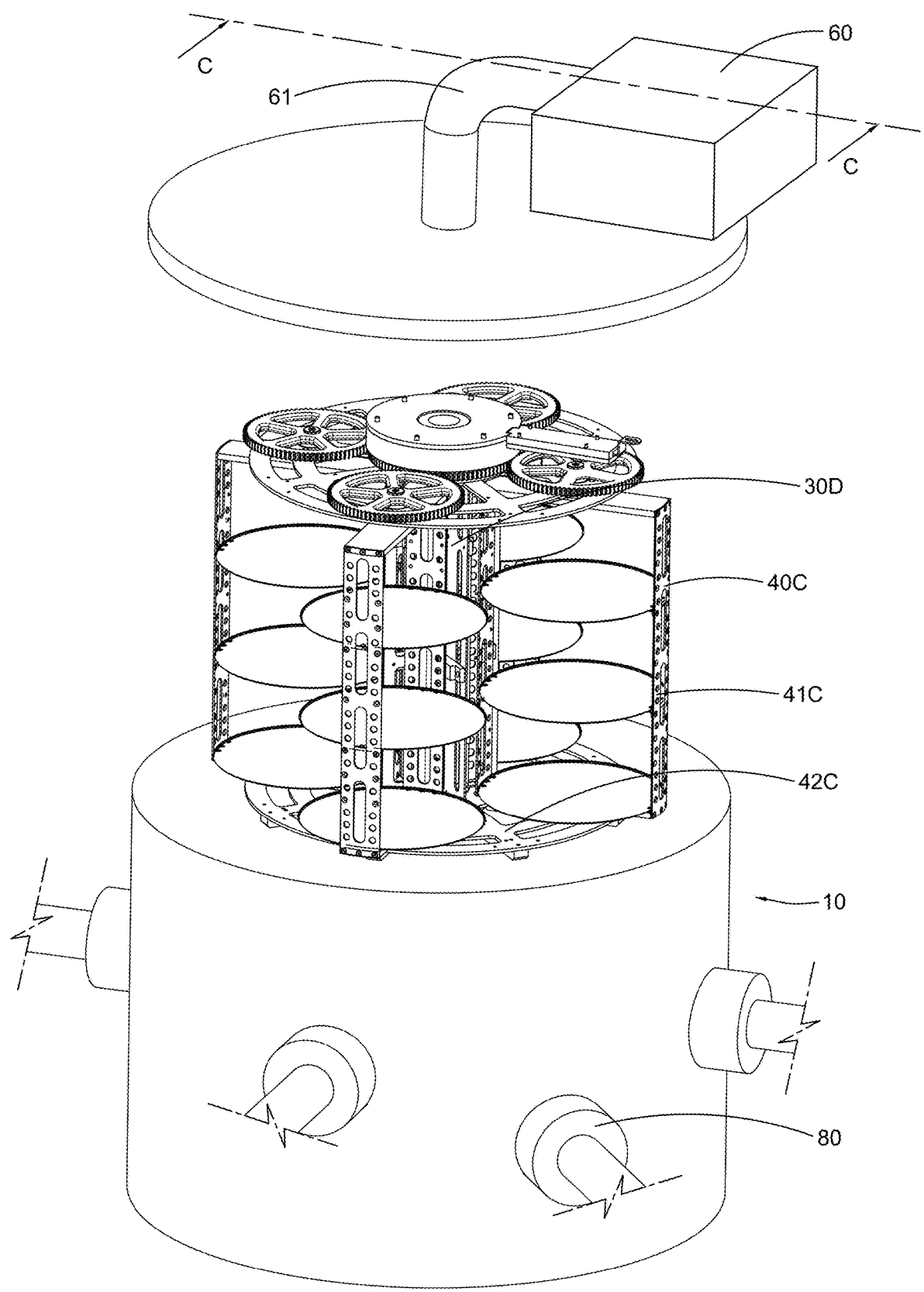
FIG. 10A is an exploded view of the coating apparatus according to a third alternative mode of the above third preferred embodiment of the present invention.
Figure 10B:
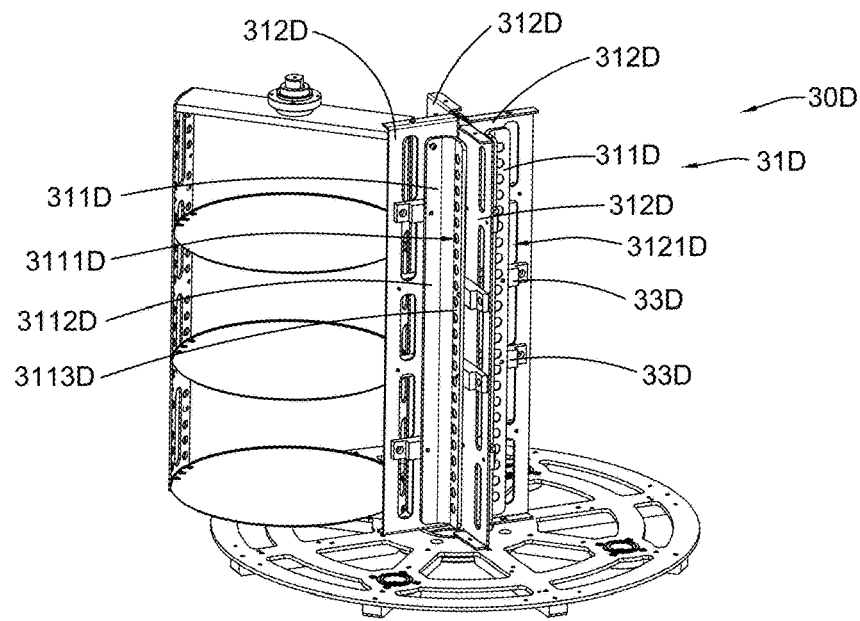
FIG. 10B is a perspective view illustrating a supporting rack and a plasma generation source of the coating apparatus according to the above third preferred embodiment of the present invention.
Figure 10C:
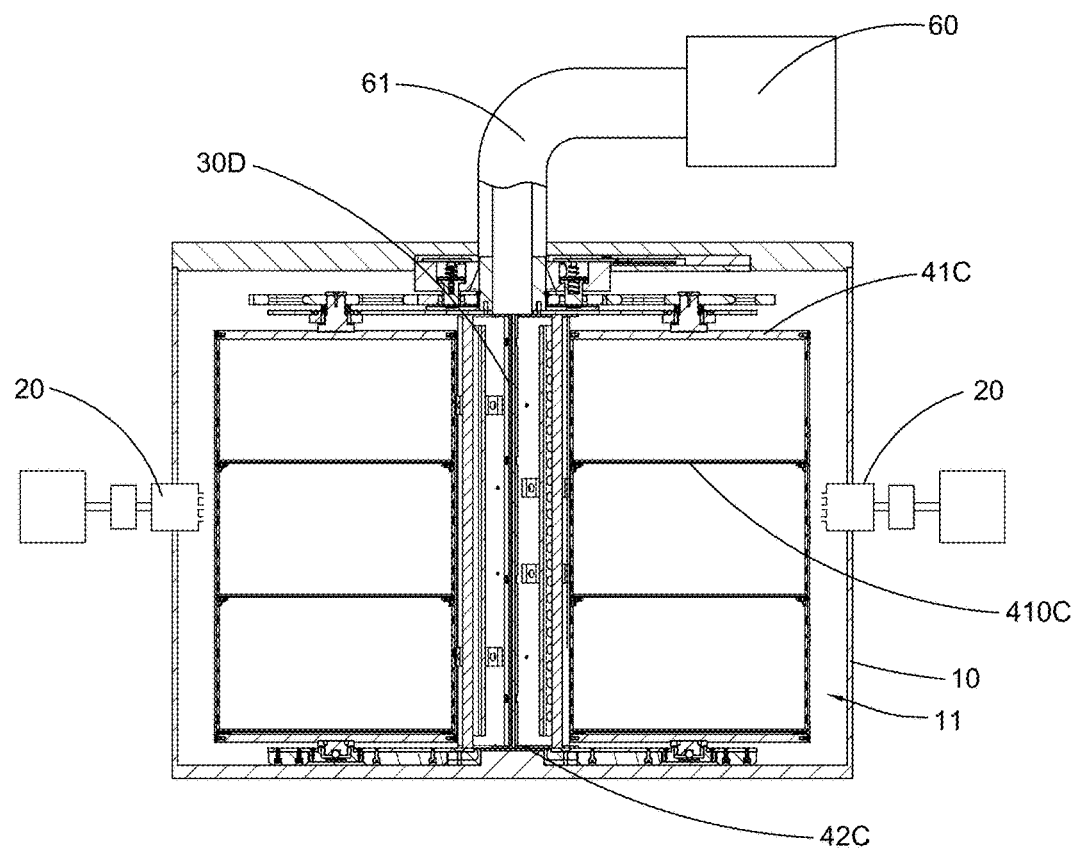
FIG. 10C is a sectional view along line C-C in FIG. 10A.

FIGS. 10A to 10C of drawings further illustrate the coating apparatus according to a third alternative mode of the third preferred embodiment of the present invention. More specifically, as shown in the drawings, the coating apparatus of this preferred embodiment comprises a chamber body 10 having a reaction chamber 11, one or more monomer discharge sources 20 for discharging a gaseous coating forming material 201 into the reaction chamber 11 of the chamber body 10, a plasma generation source 30D for exciting the coating forming material 201, and a supporting rack 40C for supporting and carrying a plurality of substrates 90.

The plasma generation source 30D of this third alternative mode of the preferred embodiment of the present invention comprises an electrode means 31D for applying an electric power to the coating forming material 201 discharged into the chamber body 10. More specifically, as an example, the electrode means 31D comprises at least one pair of electrodes, preferably, a plurality pairs of first electrode 311D and second electrode 312D are provided at the center of the reaction chamber 11.

As shown in FIG. 10B of the drawings, each of the first electrodes 311D and second electrodes 312D can be embodied as an elongated electrode plate vertically arranged in the reaction chamber 11 of the chamber body 10. In this exemplifying embodiment, four first electrodes 311D and four second electrodes 312D are alternatingly arranged along a circumferential direction.

The first electrodes 311D and the second electrodes 312D are positive and negative electrodes, and are respectively electrically connected to two connecting ends of an energy source such as a pulse radio frequency generator which is placed at an outer side of the chamber body 10. Alternatively, the first electrodes 311D can be electrically connected to the energy source, and the second electrodes 312D can be grounded, or the first electrodes 311D is grounded and the second electrodes 312D can be electrically connected to the energy source.

As an example of this third alternative mode of the preferred embodiment, each of the four first electrodes 311D, which is an arc electrical plate which is electrically connected to the energy source, is provided between two second electrodes 312D and is spaced apart from the two second electrodes 312D. Accordingly, the four second electrodes 312D are radially extending in the center of the reaction chamber 11 and can be electrically connected to the supporting rack 40C and are further grounded.

As shown in FIG. 10B of the drawings, each of the first electrodes 311D may have a first arc portion 3112D facing toward a second electrode 312D and a second arc portion 3113D facing toward another second electrode 312D for electrically discharging.

A plurality of electrical insulating members 33D may be provided between the adjacent first electrode 311D and the second electrode 312D to prevent the electrical connecting between the first and second electrodes 311D and 312D, and also may function as connecting members to mount the first electrodes 311D to the second electrodes 312D.

In addition, the first electrode 311D has a plurality of first holes 3111D and the second electrode 312C has a plurality of second holes 3121D, so as to facilitate the coating forming material 201 to flow into the space in the electrode means 31D and be excited by the electrode means 31D to produce plasma, and to allow the generated reactive precursor species to flow to the substrates 90 supported on the supporting rack 40C.

The coating apparatus may further comprise a plasma source gas feeding unit 80 for feeding a plasma source gas, which includes, but not limited to, an inert gas and nitrogen, into the reaction chamber 11 of the chamber body 10. Accordingly, before the monomer discharge sources 20 feeds the coating forming material 201 into the reaction chamber 11, the plasma source gas can be injected into the reaction chamber 11 to produce the plasma in the effect of the plasma generation source 30D or other electrical discharging means, so as to provide a plasma environment for the coating forming material 201.

Figures 11, 12:
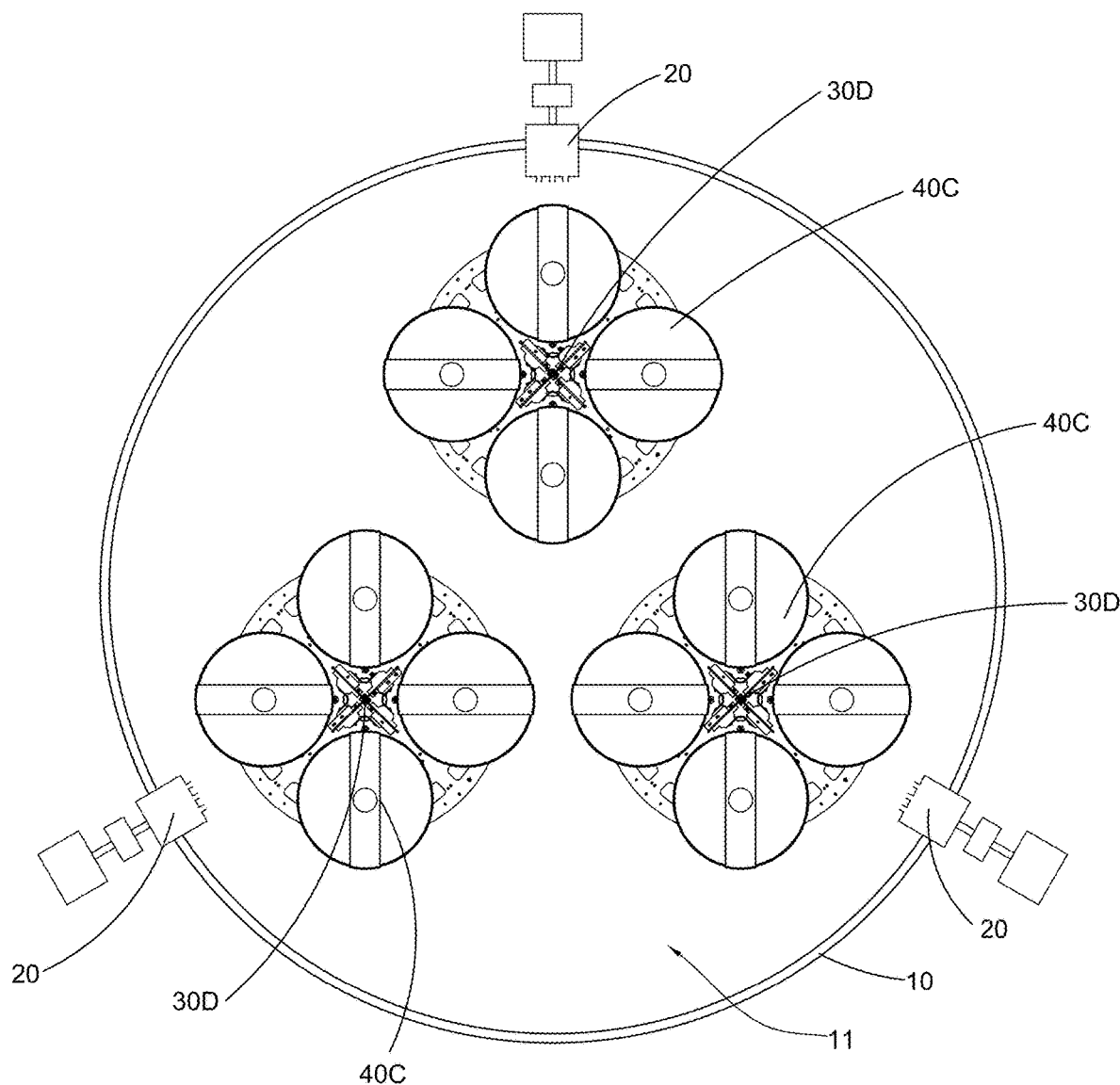
FIG. 11 is a schematic view of the coating apparatus according to a fourth alternative mode of above third preferred embodiment of the present invention.
FIG. 12 illustrates a table of the thicknesses and water contact angles of the polymer coatings in four examples prepared by the coating apparatus according to the third alternative mode of above third preferred embodiment of the present invention.

As shown in FIG. 11, according to a fourth alternative mode of the above third preferred embodiment, the coating apparatus of this fourth alternative mode of the preferred embodiment comprises a chamber body 10 having a reaction chamber 11, one or more monomer discharge sources 20 for discharging a gaseous coating forming material 201 into the reaction chamber 11 of the chamber body 10, a plurality of plasma generation sources 30D for exciting the coating forming material 201, and a plurality of supporting racks 40C for supporting and carrying a plurality of substrates 90. In this embodiment, each plasma generation source 30D is surrounded by a corresponding supporting rack 40C.

According to this fourth alternative mode of the preferred embodiment of the present invention, a coating method for depositing the polymer coating 92 on the surface 91 of each of the plurality of substrates 90 comprises the following steps.

(α) Surround the plasma generation source 30B/30C/30D by the plurality of substrates 90 and configure the monomer discharge source 20 and the plasma generation source 30B/30C/30D at two opposite sides of the substrates 90.

(β) Discharge the coating forming material 201 into the reaction chamber 11 of the chamber body 10 to plasma processing the substrates 90 by the plasma generation source 30B/30C/30D.

Accordingly, in the step (α), the plasma generation source 30B/30C/30D is arranged at an inner side of the substrates 90 while the monomer discharge source 20 is arranged at an outer side of the substrates 90. The plasma generation source 30B/30C/30D can be arranged at a central area of the reaction chamber 11 and the substrates 90 are encircled around the plasma generation source 30B/30C/30D.

In the step (β), at least a proportion of the coating forming material 201 is required to pass through the supporting rack 40B/40C which is carried with the substrates 90 before reaching to the plasma generation source 30B/30C/30D.

The step (β) may further comprise a step of circumferentially arranging a plurality of the monomer discharge sources 20 and radially discharging the coating forming material 201 through the monomer discharge sources 20 towards the plasma generation source 30B/30C/30D at the central area of the reaction chamber 11 of the chamber body 10.

The coating method may further comprise the steps of rotating a rotation rack 42B about the central axis X and rotating the carrier racks 41B about the central axis Y, wherein each of the carrier racks 41B, which is used for carrying the substrates 90, is supported on the rotation rack 42B to rotate about the axis X along with the rotation rack 42B while simultaneously rotate about its own axis Y.

Furthermore, the following four examples illustrate preparing polymer coatings 92 which are hydrophobic coatings on the substrates 90 using the coating apparatus of the present invention. Particularly, the coating apparatus in the FIGS. 10A to 10C is employed in the following four examples.

EXAMPLE 1

In this example, each substrate 90 is a PCB which is supported on the carrier rack 41C of the supporting rack 40C within the reaction chamber 11. And then the supporting rack 40C is driven to move, the movable rack 42C is rotating about the axis X while the carrier racks 41C is rotating about the axis Y while rotating about the axis X along with the movable rack 42C. The reaction chamber 11 is continually vacuumed to maintain a vacuum degree of 20 millitorrs. A volume of the reaction chamber 11 is 50 liters, and a temperature of the reaction chamber 11 is controlled at 40° C.

Helium, which is a plasma source gas, is introduced into the reaction chamber 11 through the plasma source gas feeding unit 80, and a flow of the plasma source gas being fed is 20 sccm (standard cubic centimeter per minute). The plasma generation source 30D is in operation to process the PCBs with an electrical discharging power of 120 W and an electrical discharging period of 100 s.

And then, the coating forming material 201, which is gaseous perfluorodecylacrylate (1H, 1H, 2H, 2H-heptadecafluorodecyl acrylate) vaporized from the raw material, is introduced into the reaction chamber 11 through the monomer discharge sources 20, so as to prepare the polymer coatings 92 on the substrates 90 by a plasma chemical vapor deposition process. In the process, a flow of the monomer fed is 150 μL/min, an energy output mode of the plasma radio frequency is by pulse, an electrical discharging power is 300 W, an electrical discharging duration is 3600 s, a frequency is 1000 Hz, and a pulse duty ration is 1:500.

After the coating process, air is fed into the reaction chamber 11 to make the reaction chamber reach atmospheric pressure. And then the PCBs coated with the hydrophobic coatings can be taken out of the reaction chamber 11.

EXAMPLE 2

In this example, each substrate 90 is a copper plate which is supported on the carrier rack 41C of the supporting rack 40C within the reaction chamber 11. And then the supporting rack 40C is driven to move, the movable rack 42C is rotating about the axis X while the carrier racks 41C is rotating about the axis Y while rotating about the axis X along with the movable rack 42C. The reaction chamber 11 is continually vacuumed to maintain a vacuum degree of 50 millitorrs. A volume of the reaction chamber 11 is 200 liters, and a temperature of the reaction chamber 11 is controlled at 50° C.

Helium, which is a plasma source gas, is introduced into the reaction chamber 11 through the plasma source gas feeding unit 80, and a flow of the plasma source gas being fed is 40 sccm. The plasma generation source 30D is in operation to process the copper plates with an electrical discharging power of 200 W and an electrical discharging period of 120 s.

And then, the coating forming material 201, which is gaseous 1H, 1H, 2H, 2H-perfluorooctyl acrylate vaporized from the raw material, is introduced into the reaction chamber 11 through the monomer discharge sources 20, so as to prepare the polymer coatings 92 on the substrates 90 by a plasma chemical vapor deposition process. In the process, a flow of the monomer fed is 200 µL/min, an energy output mode of the plasma radio frequency is by pulse, an electrical discharging power is 300 W, an electrical discharging duration is 3000 s, a frequency is 100 Hz, and a pulse duty ration is 1:100.

After the coating process, air is fed into the reaction chamber 11 to make the reaction chamber reach atmospheric pressure. And then the copper plates coated with the hydrophobic coatings can be taken out of the reaction chamber 11.

EXAMPLE 3

In this example, each substrate 90 is a PCB which is supported on the carrier rack 41C of the supporting rack 40C within the reaction chamber 11. And then the supporting rack 40C is driven to move, the movable rack 42C is rotating about the axis X while the carrier racks 41C is rotating about the axis Y while rotating about the axis X along with the movable rack 42C. The reaction chamber 11 is continually vacuumed to maintain a vacuum degree of 80 millitorrs. A volume of the reaction chamber 11 is 200 liters, and a temperature of the reaction chamber 11 is controlled at 50° C.

Helium, which is a plasma source gas, is introduced into the reaction chamber 11 through the plasma source gas feeding unit 80, and a flow of the plasma source gas being fed is 100 sccm. The plasma generation source 30D is in operation to process the PCBs with an electrical discharging power of 300 W and an electrical discharging period of 120 s.

And then, the coating forming material 201, which is gaseous 2-(perfluorodecyl)ethyl methacrylate vaporized from the raw material, is introduced into the reaction chamber 11 through the monomer discharge sources 20, so as to prepare the polymer coatings 92 on the substrates 90 by a plasma chemical vapor deposition process. In the process, a flow of the monomer fed is 180 µL/min, an electrical discharging power is 10 W, an electrical discharging duration is 3600 s.

After the coating process, air is fed into the reaction chamber 11 to make the reaction chamber reach atmospheric pressure. And then the PCBs coated with the hydrophobic coatings can be taken out of the reaction chamber 11.

EXAMPLE 4

In this example, each substrate 90 is an electronic component which is supported on the carrier rack 41C of the supporting rack 40C within the reaction chamber 11. And then the supporting rack 40C is driven to move, the movable rack 42C is rotating about the axis X while the carrier racks 41C is rotating about the axis Y while rotating about the axis X along with the movable rack 42C. The reaction chamber 11 is continually vacuumed to maintain a vacuum degree of 50 millitorrs. A volume of the reaction chamber 11 is 500 liters, and a temperature of the reaction chamber 11 is controlled at 60° C.

Helium, which is a plasma source gas, is introduced into the reaction chamber 11 through the plasma source gas feeding unit 80, and a flow of the plasma source gas being fed is 60 sccm. The plasma generation source 30D is in operation to process the substrates 90 with an electrical discharging power of 200 W and an electrical discharging period of 100 s.

And then, the coating forming material 201, which is gaseous 2-(perfluorododecyl)ethyl acrylate vaporized from the raw material, is introduced into the reaction chamber 11 through the monomer discharge sources 20, so as to prepare the polymer coatings 92 on the substrates 90 by a plasma chemical vapor deposition process. In the process, a flow of the monomer fed is 350 µL/min, an electrical discharging power is 50 W, an electrical discharging duration is 3600 s.

After the coating process, air is fed into the reaction chamber 11 to make the reaction chamber reach atmospheric pressure. And then the electronic components coated with the hydrophobic coatings can be taken out of the reaction chamber 11.

A thickness of each polymer coating 92 prepared in the above four examples is measured by a thin film analyzer of Filmetrics F20-UV, and a water contact angle of each polymer coating 92 is measured according to the measuring standard requirements of GB/T30447-2013, and the measured result is shown in FIG. 12.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and are subject to change without departure from such principles. Therefore, this invention includes all modifications encompassed within the spirit and scope of the following claims.

What is claimed is:

1. A coating apparatus for coating a plurality of substrates by a coating forming material, comprising:
   a chamber body having a reaction chamber;
   a supporting rack having a supporting area for supporting the substrates within said reaction chamber of said chamber body;
   a plurality of monomer discharge sources having a discharge inlet for introducing the coating forming material into said reaction chamber of said chamber body; and
   a plasma generation source disposed in said reaction chamber of said chamber body for exciting the coating forming material, wherein said supporting area of said supporting rack is located at a position between said monomer discharge source and said plasma generation source in such manner that the substrates are adapted for being arranged between said monomer discharge source and said plasma generation source;

wherein said supporting rack comprises a movable rack and a plurality of carrier racks supported on the movable rack, wherein said plurality of carrier racks are spaced from each other, wherein each of said carrier racks has said supporting area for supporting the substrates; and wherein said plasma generation source is disposed at the center of said reaction chamber, and the plurality of monomer discharge sources are disposed around said plasma generation source, when the substrates are supported on said carrier racks, the plurality of monomer discharge sources and the plasma generation source are respectively arranged at two opposite sides of each corresponding substrate;

wherein said plasma generation source comprises an electrode means for applying an electric power to the coating forming material, and said electrode means comprises first and second concentric cylindrical electrodes disposed at the center of said reaction chamber, and the plurality of monomer discharge sources are disposed around said electrode means.

2. The coating apparatus, as recited in claim 1, wherein said movable rack is operable to rotate about a central axis thereof, wherein each of said carrier racks is operable to rotate about a central axis of each of said carrier racks while rotating along with said movable rack.

3. The coating apparatus, as recited in claim 2, wherein said supporting rack further comprises a motion transmission arrangement which comprises a first gear member mounted to said movable rack and a plurality of second gear members mounted to said carrier racks respectively, wherein said second gear members are respectively engaged with said first gear member.

4. The coating apparatus, as recited in claim 2, wherein each of said first electrode and said second electrode is a cylindrical electrode and said first electrode is sleeved around said second electrode, wherein said first electrode has a plurality of first holes.

5. The coating apparatus, as recited in claim 4, wherein said second electrode has a plurality of second holes.

6. The coating apparatus, as recited in claim 1, further comprising a pressure adjustment unit which comprises a gas extracting member, wherein said plasma generation source is arranged at a center of said supporting rack, wherein said gas extracting member is arranged above said plasma generation source.

7. The coating apparatus, as recited in claim 1, wherein the coating forming material is selected from the group consisting of a material including —CF3 based perfluoro compounds, perfluorinated alkenes, hydrogen containing unsaturated compounds, optionally substituted alkynes, polyether substituted alkenes, organic compounds comprising two double bonds, saturated organic compounds having an optionally substituted alkyl chain of at least five carbon atoms optionally interposed with a heteroatom, and macrocycles containing at least one heteroatom.

8. The coating apparatus, as recited in claim 1, wherein the coating forming material is selected from the group consisting of 3-(perfluoro-5-methylhexyl)-2-hydroxypropyl methacrylate, 2-(perfluorodecyl)ethyl methacrylate, 2-(perfluorohexyl)ethyl methacrylate, 1,1,2,2-Tetrahydroperfluorotetradecyl acrylate, 1H,1H,2H,2H-Heptadecafluorodecyl acrylate, 1H,1H,2H,2H-Perfluorooctylacrylate, 2-(Perfluorobutyl)ethyl acrylate, (2H-perfluoropropyl)-2-acrylate, (perfluorocyclohexyl)methyl acrylate, 3,3,3-trifluoro-1-propyne, and 1-ethynyl-3,5-difluorobenzene, and 4-ethynyltrifluorotoluene.

9. The coating apparatus, as recited in claim 1, wherein the coating forming material is selected from the group consisting of ethoxylated trimethylolpropane triacrylate, tripropylene glycol diacrylate, divinylbenzene, poly(ethylene glycol) diacrylate, 1,6-hexanediol diacrylate, ethylene glycol diacrylate, diethylene glycol divinyl ether and neopentyl glycol diacrylate.

10. The coating apparatus, as recited in claim 1, wherein the coating forming material has a following formula:

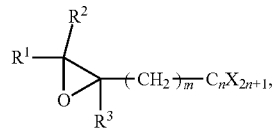

wherein R1, R2, and R3 are hydrophobic groups and are independently selected from the group consisting of hydrogen, alkyl, halogen, and haloalkyl, wherein m is an integer from 0-8, n is an integer from 1-15, X is selected from the group consisting of hydrogen and halogen.

11. The coating apparatus, as recited in claim 1, wherein the coating forming material is excited for forming a polymer coating which is selected from the group consisting of an acrylic coating, an epoxy coating, a silicone coating, a polyurethane coating, and a paraxylene coating.

12. The coating apparatus, as recited in claim 1, wherein the substrate is selected from the group consisting of metal, glass, ceramic, polymer, fabrics, plastic, electronic device, and semiconductor.

* * * * *